US006716569B2

(12) United States Patent
Hotta et al.

(10) Patent No.: US 6,716,569 B2
(45) Date of Patent: Apr. 6, 2004

(54) PREPARATION METHOD FOR LITHOGRAPHIC PRINTING PLATE

(75) Inventors: Hisashi Hotta, Shizuoka-Ken (JP); Atsushi Sakamoto, Shizuoka-Ken (JP)

(73) Assignee: Fuji Photo Film Co., Ltd., Minami-Ashigara (*) Notice: Subject to any disclaimer, the term of this patent is extended or adjusted under 35 U.S.C. 154(b) by 170 days.

(21) Appl. No.: 09/897,028

(22) Filed: Jul. 3, 2001

(65) Prior Publication Data

US 2002/0039703 A1 Apr. 4, 2002

(30) Foreign Application Priority Data

Jul. 7, 2000 (JP) .................................... 2000-206310
Jul. 14, 2000 (JP) .................................... 2000-213741
Sep. 26, 2000 (JP) .................................... 2000-291851

(51) Int. Cl.[7] ............................................ G03F 7/00
(52) U.S. Cl. .................................... 430/302; 205/214
(58) Field of Search ......................... 430/302; 205/214

(56) References Cited

U.S. PATENT DOCUMENTS 2,946,683 A * 7/1960 Mellan et al. .............. 430/161
4,225,398 A * 9/1980 Hasegawa et al. ............ 205/98
4,238,279 A * 12/1980 Tsubai et al. ............... 216/108
4,360,401 A * 11/1982 Gray .......................... 216/102
4,452,674 A 6/1984 Gillich et al.
4,482,444 A * 11/1984 Frass et al. .............. 430/278.1
4,502,925 A * 3/1985 Walls ...................... 430/276.1
4,566,960 A * 1/1986 Mohr ......................... 205/658
4,614,571 A * 9/1986 Pliefke ....................... 205/674
5,110,710 A 5/1992 Tomita et al.
5,834,129 A * 11/1998 Dhillon et al. .............. 428/654
5,837,425 A * 11/1998 Nakanishi et al. .......... 430/302
5,873,771 A * 2/1999 Uesugi ........................ 451/36
5,900,345 A * 5/1999 Platzer et al. ............... 430/156
6,010,816 A * 1/2000 Nishio et al. ............... 430/165
6,015,649 A * 1/2000 Mori .......................... 430/193
6,045,681 A * 4/2000 Mori .......................... 205/214
6,071,674 A * 6/2000 Hattori ..................... 430/278.1
6,114,089 A * 9/2000 Takita et al. ............. 430/278.1
6,258,510 B1 * 7/2001 Maemoto ................. 430/278.1
6,340,426 B1 * 1/2002 Uesugi ....................... 205/687
6,475,630 B1 * 11/2002 Uesugi et al. .............. 428/472

FOREIGN PATENT DOCUMENTS

| | | | |
|---|---|---|---|
| EP | 0 373 510 | A | 6/1990 |
| EP | 0904954 | A2 | 3/1999 |
| JP | 9-244227 | | 9/1997 |
| JP | 10-339953 | A | 12/1998 |
| JP | 11-059007 | A | 3/1999 |

* cited by examiner

*Primary Examiner*—Mark F. Huff
*Assistant Examiner*—Amanda C. Walke
(74) *Attorney, Agent, or Firm*—Burns, Doane, Swecker & Mathis, L.L.P.

(57) ABSTRACT

The present invention relates to a preparation method for a lithographic printing plate, which comprises forming a presensitized plate by coating a photosensitive layer or thermosensitive layer on an aluminum substrate treated with an aqueous solution after optionally anodized and developing the presensitized plate with a developer comprising no silicate, wherein the aqueous solution comprises at least one compound selected from the group consisting of nitrite group-containing compound, fluorine atom-containing compound and phosphorous atom-containing compound, in the proviso that when the at least one compound is fluorine atom-containing compound, the treated aluminum substrate has a surface which satisfies the formula: $0.30 \leqq A/(A+B) \leqq 0.90$ (wherein, A represents peak area of fluorine atom (1S) (counts·eV/sec) determined by X ray Electron Spectroscopy for Chemical Analysis (ESCA), and B represents peak area of aluminum atom (2P) (counts·eV/sec) determined by X ray ESCA), and when the at least one compound is phosphorous atom-containing compound, the treated aluminum substrate has a surface which satisfies the formula: $0.05 \leqq A/(A+B) \leqq 0.70$ (wherein, A represents peak area of phosphorous atom (2P) (counts·eV/sec) determined by X ray ESCA, and B represents peak area of aluminum atom (2P) (counts·eV/sec) determined by X ray ESCA).

15 Claims, No Drawings

PREPARATION METHOD FOR LITHOGRAPHIC PRINTING PLATE

BACKGROUND OF THE INVENTION

The present invention relates to a preparation method for a lithographic printing plate from a photosensitive or thermosensitive presensitized plate. The properties of the plate such as remaining of colors and remaining of films in the non-image area, contamination of the printed matters at the portion corresponding to the non-image area and printing durability are improved.

Conventional presensitized plate for the preparation of a lithographic printing plate has an ink-receptive photosensitive layer formed on a hydrophilic substrate. When such photosensitive layer of the presensitized plate is image-wise exposed followed by development of the exposed photosensitive layer with a developer, the area of the photosensitive layer exposed to light is removed to expose hydrophilic surface of the substrate. On the other hand, the area of the photosensitive layer that is not exposed to light remains on the surface of the substrate to form an ink-receptive image portion to thus provide a lithographic printing plate. In such printing plate, in order to prevent contamination of the printed matter caused by adhesion of ink to the non-image area, it is necessary to make the non-image area more hydrophilic. Conventionally, by using a developer containing alkaline metal silicate to develop such plate, non-image area of the plate may be hydrophilized to reduce the contamination. However, when such developer containing alkaline metal silicate is used, the following problems were observed; a solid precipitate resulted from $SiO_2$ is easily produced, and gel resulted from $SiO_2$ was produced when wastewater from the developer is neutralized. Also, such developer may cause a problem such as re-absorption of lipophilic component such as dye and resin dissolved in the developer on the alkaline metal silicate that is absorbed during the development to result in deterioration of the properties such as remaining of color or remaining of film in the non-image area.

In order to solve these problems, a developer comprising at least 0.01 mol/L of at least one compound selected from saccharides, oximes, phenols and fluorinated alcohols as a developing stabilizer and an alkaline agent (that is, silicate-free developer) may be utilized. However, when such developer is used for the conventional presensitized plate for a lithographic printing plate, anodized film on an aluminum substrate was dissolved by the developer to result in accumulating of the dissolved material in the developer. Thus produced mud or sludge deteriorates the detergency of the automatic developing machine and chokes the spray nozzles. Further, if a printing plate developed by such developer was left during developing process, it would be difficult to remove ink that is adhered to (that is so-called "Hochi-yogore" (contamination after being left)).

In order to solve these problems, there has been proposed a various methods for treating anodized film on the substrate. But steam treatment that was known as a method to prevent dissolution of the film during development, can not solve the problem of contamination after being left although it prevents remaining of color in the non-image area or remaining of film. Although the treatment of anodized film with a silicate can solve the problem of contamination after being left, problems as to printing durability, deterioration of property of remaining of color or film can not be solved.

The above problems are likewise caused when a presensitized plate having a thermosensitive layer that can be directly made up from the data of letter or image using laser light is used.

SUMMARY OF THE INVENTION

The purpose of the present invention is to provide a preparation method for a lithographic printing plate, having good properties with regard to remaining of colors, remaining of films, printing durability and contamination as well as prevention of a formation of mud or sludge in a developer.

The inventors of the present invention have conducted various studies to accomplish the foregoing objects and have found that the foregoing problems can be solved by a lithographic printing plate prepared by treating a surface of an anodized aluminum substrate with an aqueous solution comprising at least one compound selected from the group consisting of nitrite group-containing compound, fluorine atom-containing compound and phosphorous atom-containing compound, coating the treated substrate with a photosensitive layer or thermosensitive layer, image-wise exposing to light and developing it with a developer comprising no silicate. Such lithographic printing plate has good properties with regard to remaining of colors, remaining of film, printing durability and contamination as well as prevention of the formation of mud or sludge in the developer.

That is, the present invention provides a preparation method for a lithographic printing plate, which comprises forming a presensitized plate by coating a photosensitive layer or thermosensitive layer on an anodized aluminum substrate treated with an aqueous solution and developing the presensitized plate with a developer comprising no silicate, wherein the aqueous solution comprises at least one compound selected from the group consisting of nitrite group-containing compound, fluorine atom-containing compound and phosphorous atom-containing compound, with the proviso that when the at least one compound is fluorine atom-containing compound, the treated aluminum substrate has a surface which satisfies the formula: $0.30 \leqq A/(A+B) \leqq 0.90$ wherein, A represents peak area of fluorine atom (1S) (count·eV/sec) determined by X ray Electron Spectroscopy for Chemical Analysis (ESCA), and B represents peak area of aluminum atom (2P) (counts ·eV/sec) determined by X ray ESCA, and when the at least one compound is phosphorous atom-containing compound, the treated aluminum substrate has a surface which satisfies the formula: $0.05 \leqq A/(A+B) \leqq 0.70$ wherein, A represents peak area of phosphorous atom (2P) (count·eV/sec) determined by X ray ESCA, and B represents peak area of aluminum atom (2P) (count·eV/sec) determined by X ray ESCA.

Generally, a thermal conductivity of an aluminum substrate of a presensitized plate with a thermosensitive layer is rather high than that of the thermosensitive layer. Therefore, heat around the interface between the thermosensitive layer and the substrate easily transfers to the inside of the substrate before substantial progress of an image-forming reaction. As the result, some portion of the positive-working thermosensitive layer, which the portion normally should be non-image area, would remain and some portion of the negative-working thermosensitive layer, which normally should be image area, may not be formed as an image due to insufficient polymerization reaction (low sensitivity). However, it is found that the sensitivity of the presensitized plate with the thermosensitive layer prepared by the method of the present invention is higher than that of the conventional ones. The reason for the fact is not clear but the following reason can be considered. For example, when the anodized substrate was treated with an aqueous solution comprising at least one compound selected from the group consisting of nitrite group-containing compound, fluorine atom-containing compound and phosphorous atom-containing compound, the anodized film is sealed hydrophilically to form an airspace which shows low thermal conductivity. It is considered that such airspace may inhibit the transfer of the heat caused by irradiation of laser light to the thermosensitive layer.

DESCRIPTION OF THE PREFERRED EMBODIMENTS

The method of the present invention will be explained in detail below.

Aluminum Substrate

In the present invention, the aluminum substrate, which has been anodized by the after-mentioned method, should be treated with an aqueous solution comprising at least one compound selected from the group consisting of nitrite group-containing compound, fluorine atom-containing compound and phosphorous atom-containing compound.

Treatment of Substrate with an Aqueous Solution Comprising Nitrite Group-containing Compound Examples of nitrite group-containing compound used in the present invention include nitrous acid and salts thereof. Examples of salt of nitrous acid (nitrite) include metal salt of nitrous acid, which the metal group is selected from Ia, IIa, IIIa, IVa, VIa, VIIa, VIII, IIb, IIIb or IVb group of periodic table, and ammonium nitrite. Specific examples of metal salts of nitrous acid include $LiNO_2$, $NaNO_2$, $KNO_2$, $Mg(NO_2)_2$, $Ca(NO_2)_2$, $Zn(NO_2)_2$, $Al(NO_2)_2$, $Zr(NO_2)_4$, $Sn(NO_2)_4$, $Cr(NO_2)_3$, $Co(NO_2)_2$, $Mn(NO_2)_2$ and $Ni(NO_2)_2$, with alkali metal nitrite being particularly preferred. The above nitrite can be used alone or in combination. Moreover, nitrite can be used with (free) nitrous acid.

The amount of nitrous acid or nitrite in the aqueous solution utilized in the present invention ranges from 0.001 to 10% by weight. More preferably, the amount of nitrous acid or nitrite in the aqueous solution ranges from 0.01 to 5% by weight and most preferably, from 0.1 to 2% by weight.

The temperature range for the treatment of the surface of substrate with the solution is from room temperature to about 100° C., preferably from 30° C. to 100° C. and more preferably from 60° C. to 100° C. The time for the treatment ranges from 0.1 to 600 seconds, preferably from 1 to 300 seconds and more preferably from 3 to 100 seconds.

The solution comprising nitrous acid or nitrite may optionally comprise additives. Examples of such additives are phosphate, silicate, surfactant, carboxylic acid salt (carboxylate), water-soluble polymer and silane coupling agent.

Preferred example of phosphate used as the additive in the present invention is a hydrophilic phosphate and specific examples thereof includes monobasic, dibasic and tribasic phosphates such as $NH_4H_2PO_4$, $(NH_4)_2HPO_4$, $NaH_2PO_4$, $KH_2PO_4$, $K_2HPO_4$, $ZnHPO_4$, $NH_4NaHPO_4$, $NH_4KHPO_4$, $NH_4CaPO_4$, $Al(H_2PO_4)_3$, $Al_2(HPO_4)_3$, $MnHPO_4$, $Mn(H_2PO_4)_2$, $MnH_3(PO_4)_2$, $Co(PO_4)_2$, $Ba(H_2PO_4)_2$, $BaHPO_4$, $LiH_2PO_4$, $Li_2HPO_4$, $Be(PO_4)_2$, $BPO_4$, $Ni_3(PO_4)_2$, $Mg_{3(PO4)_2}$, $FeHPO_4$, $Fe(PO_4)_2$, $Sr(H_2PO_4)_2$, and $SrHPO_4$. Among these phosphates, monobasic phosphate such as $KH_2PO_4$, $NaH_2PO_4$ and $NH_4H_2PO_4$ is specifically preferred. The amount of these phosphate in the aqueous solution comprising nitrous acid or nitrite is preferably from 0.001 to 10% by weight, and more preferably from 0.01 to 1% by weight.

Examples of silicate as the additive described above include alkali metal silicate such as sodium silicate as described in U.S. Pat. Nos. 2,714,066 or 3,181,461, or alkaline earth metal silicate as described in Japanese Un-examined Patent Publication (hereunder referred to as "J.P. KOKAI") No. Sho 60-194095. The amount of metal silicate in the aqueous solution comprising nitrous acid or nitrite is preferably from 0.001 to 10% by weight and more preferably from 0.01 to 1% by weight.

Surfactant used as the additive described above are anionic, cationic, amphoteric, nonionic and fluorine atom-containing surfactants. Examples of the anionic surfactant include an ester of alkylsulfonic acid, a salt of alkylbenzenesulfonic acid, and a salt of alkylnaphthalenesulfonic acid. Examples of cationic surfactant include quaternary ammonium salts and alkylamine salts. Examples of amphoteric surfactant include laurylcarboxymethylhydroxyethyl, and imidazolinium betaine. Examples of nonionic surfactant include fatty acid glycerin ester, fatty acid sorbitan ester and fatty acid polyoxyethylene ester. Examples of fluorine atom-containing surfactant include fluoroaliphatic group. The amount of these surfactants in the aqueous solution comprising nitrous acid or nitrite is preferably from 0.001 to 10% by weight and more preferably from 0.01 to 1% by weight.

Examples of carboxylic acid salt (carboxylate) used as the additive described above include sodium benzoate, magnesium oleate, zinc succinate, sodium phthalate, titanium phthalate, sodium propionate, sodium butyrate, sodium oxalate, barium oxalate, manganese oxalate, sodium malonate, magnesium malonate, sodium succinate, strontium succinate, sodium glutarate, strontium glutarate, sodium formate, ammonium formate, ammonium acetate, and sodium acetate. The amount of these carboxylate in the aqueous solution comprising nitrous acid or nitrite ranges preferably from 0.001 to 10% by weight and more preferably from 0.01 to 1% by weight.

The hydrophilic polymer utilized as the additive described above are CMC, hydroxy ethyl cellulose, sodium alginate, gelatin, tragacanth, gum arabic, soluble starch, copolymer of acrylic acids such as polyacrylic acid, polyacrylamide, polyvinylalcohol and polyvinylpyrrolidone, and polyurethane resin of maleic acid copolymer such as polyalkylamino ethyl acrylate. The amount of the hydrophilic polymer in the aqueous solution comprising nitrous acid or nitrite is preferably from 0.001 to 10% by weight and more preferably from 0.01 to 1% by weight.

Examples of the silane coupling agent utilized as the additive described above include γ-aminopropylethoxysilane, 3-hydroxypropyltrimethoxysilane, tetramethoxysilane, and N-(β-aminoethyl)-γ-aminopropylmethyldimethoxysilane. The amount of these silane coupling agent is preferably 0.001 to 10% by weight and more preferably 0.01 to 1% by weight in an aqueous solution containing nitrous acid or nitrate.

In addition, it may be possible to treat the plate with the foregoing silicate, carboxylate, phosphate, surfactant, silane coupling agent, hot water or steam before or after the treatment with the aqueous solution comprising nitrous acid or nitrite.

Treatment of Substrate with an Aqueous Solution Comprising Fluorine Atom-containing Compound It is necessary that the surface of the aluminum substrate treated with an aqueous solution comprising fluorine atom-containing compound satisfies the relationship represented by the formula: $0.30 \leqq A/(A+B) \leqq 0.90$ wherein, A represents peak area of fluorine atom (1S) (counts·eV/sec) determined by X ray Electron Spectroscopy for Chemical Analysis (hereinafter, it is also referred to as ESCA, and B represents peak area of aluminum atom (2P) (counts·eV/sec) determined by X ray ESCA).

Hereinafter X ray ESCA will be explained.

When X ray having a certain energy (hν) is radiated to the surface of a sample under ultrahigh vacuum, an electron (photoelectron) is emitted from constitution atoms of the sample into the vacuum.

The kinetic energy ($E_K$) of the emitted photoelectron may be represented by the equation (I) and $E_K$ can be determined by an energy analyzer to provide the binding energy ($E_B$).

$$E_K=h\nu-E_B-\phi \quad (I)$$

wherein, φ is work function.

Mg—Kα (1253.6 eV) or Al—Kα (1486.6 eV), of which width of energy is small, may be utilized as X ray to be irradiated. The depth of penetration of such soft X-ray may be several micrometers from the surface of the sample.

However, there is very high possibility that a photoelectron generated in the depth of the sample loses its energy due to inelastic scattering with the other atoms before getting to the surface of the sample. Therefore, photoelectron just generated at end most surface of the sample may fly out, without clashing with the other atoms and with keeping the relationship represented by the equation (I).

Thus, the portion of several nm (several ten Å) from the surface of the sample can be determined by ESCA.

In the present invention, when a peak area of fluorine atom (1S) obtained by analyzing a surface of an aluminum substrate by ESCA is called as "A" (counts·eV/sec) and a peak area of aluminum atom (2P) obtained by analyzing a surface of an aluminum substrate by ESCA is called as "B" (counts·eV/sec), they satisfy the formula of $0.30 \leqq A/(A+B) \leqq 0.90$, preferably $0.37 \leqq A/(A+B) \leqq 0.85$, more preferably $0.45 \leqq A/(A+B) \leqq 0.85$, and most preferably $0.55 \leqq A/(A+B) \leqq 0.90$). If the ratio A/(A+B) is less than 0.30, the content of inorganic fluorinated compound in the layer is too low to obtain a desired acid-proof or alkali-proof property. If the content of inorganic fluorinated compound in the layer is above 0.90, the adhesiveness of the substrate and the photosensitive layer becomes deteriorated.

Such substrate can be obtained by treating a surface of the substrate, which has been anodized, with an aqueous solution comprising fluorine atom-containing compound and the like. A preferred method is to form a coating layer comprising fluorine atom-containing compound on a substrate. In view of durability and effects, such layer may be preferably formed on an anodized film after anodizing the aluminum substrate.

The coating layer may be formed by contacting an anodized aluminum substrate with an aqueous solution comprising fluorine atom-containing compound such as metal fluoride and inorganic fluorinated compounds. The fluorine atom-containing compound usable in the present invention is selected from the group consisting of metal fluoride, and dihydrogen hexafluorozirconate (hexafluorozirconic acid), dihydrogen hexafluorotitanate (hexafluorotitanic acid), hexafluorosilicic acid, fluorophosphoric acid, and metal or ammonium salt thereof. Specific examples thereof include sodium fluoride, calcium fluoride, potassium fluoride, magnesium fluoride, nickel fluoride, iron fluoride, dihydrogen hexafluorozirconate (hexafluorozirconic acid), potassium hexafluorozirconate, ammonium hexafluorozirconate, sodium hexafluorozirconate, dihydrogen hexafluorotitanate (hexafluorotitanic acid), sodium hexafluorotitanate, potassium hexafluorotitanate, ammonium hexafluorotitanate, hexafluorosilicic acid, fluorophosphoric acid, ammonium fluorophosphate. The compound can be used alone or in combination. Preferable inorganic fluorinated compounds include sodium fluoride, potassium fluoride, ammonium fluoride and lithium fluoride.

The concentration of such inorganic fluorinated compound in the aqueous solution is suitably from 0.001 g/L to 100 g/L, preferably from 0.01 g/L to 50 g/L and more preferably from 0.1 g/L to 20 g/L. For example, the aluminum substrate may be contacted with such aqueous solution having pH of 2 to 6 at 25° C., preferably having pH of 3 to 5 for 0.5 seconds to 6 minutes and more preferably for 1 second to 30 seconds at 20° C. to less than 100° C. and preferably from 30 to 70° C. The contact may be performed by immersion of the substrate in the solution, by spraying the aqueous solution onto the anodized film on the surface of the substrate or by contacting the aqueous solution in the form of steam with the surface of the substrate. Any known method with proviso that the temperature and the time for contact can be controlled.

Also, in order to improve the hydrophilicity of the substrate, it may be possible to further treat the surface of the substrate with an aqueous solution comprising phosphate in addition to the treatment with the aqueous solution comprising an inorganic fluorinated compound to form a layer.

Such phosphates which can be used for the treatment to improve the hydrophilicity of the substrate of the present invention are metal salts of phosphoric acid such as alkali metal salt and alkaline earth metal salt. Specific examples of the phosphates include zinc phosphate, aluminum phosphate, ammonium phosphate, dibasic ammonium phosphate, monobasic ammonium phosphate, monoammonium phosphate, monopotassium phosphate, monosodium phosphate, potassium dihydrogenphosphate, dibasic potassium phosphate, calcium phosphate, sodium ammonium hydrogenphosphate, dibasic ammonium phosphate, magnesium hydrogenphosphate, magnesium phosphate, ferrous phosphate, ferric phosphate, sodium dihydrogenphosphate, sodium phosphate, dibasic sodium phosphate, lead phosphate, diammonium phosphate, monobasic calcium phosphate, lithium phosphate, phosphotungstic acid, ammonium phosphotungstate, sodium phosphotungstate, ammonium phosphomolybdate, and sodium phosphomolybdate. Also, sodium phosphite, sodium tripolyphosphate and sodium pyrophosphate can be included. Preferable examples are sodium dihydrogenphosphate, dibasic sodium phosphate, potassium dihydrogenphosphate and dibasic potassium phosphate. These compounds can be used alone or in combination of two or more compounds.

When the treatment with the phosphate is conducted, it may be possible to use a mixture solution comprising a phosphate prepared by adding the phosphate to an aqueous solution comprising inorganic fluorinated compound for the treatment, or it may be possible to treat the substrate with a solution comprising a phosphate before or after the formation of the layer comprising fluorinated compound.

The concentration of phosphate in the solution described above is suitably in the range of 10 g/L to 1000 g/L and preferably in the range of 50 g/L to 200 g/L. In addition, the same condition as used in the treatment with the aqueous solution comprising inorganic fluorinated compound described above is usable for the treatment with the phosphate.

Also, in order to improve the hydrophilicity of the substrate, it may be possible to treat the surface of the substrate with an aqueous solution comprising a silicate before or after it is treated with the aqueous solution comprising inorganic fluorinated compound to form a layer.

Examples of silicate usable in the treatment to improve the hydrophilicity of the substrate in the present invention include sodium silicate, potassium silicate and lithium silicate.

In order to conduct the treatment with such silicate, the substrate may be treated with a mixture solution comprising a silicate prepared by adding the silicate to an aqueous solution comprising an inorganic fluorinated compound, or the substrate may be treated with a solution comprising silicate before or after the formation of the layer comprising fluorinated compound.

The concentration of silicate in the solution described above is suitably in the range of 0.1 g/L to 100 g/L and preferably in the range of 1 g/L to 50 g/L. In addition, the same condition as used in the treatment with the aqueous solution comprising inorganic fluorinated compound described above is usable for the treatment with the silicate.

Also, in order to improve the hydrophilicity of the substrate, the surface of the substrate may be further treated with an aqueous solution comprising a hydrophilic resin together with the aqueous solution comprising inorganic fluorinated compound.

Examples of such hydrophilic resin usable in the treatment to improve the hydrophilicity include polyvinylphosphonic acid, polyvinyl alcohol, CMC and the like.

In order to conduct the treatment with such hydrophilic resins, a mixture solution comprising a hydrophilic resin may be prepared by adding the hydrophilic resin to an aqueous solution comprising an inorganic fluorinated compound for the treatment, or the substrate may be treated with a solution comprising hydrophilic resin before or after the formation of the layer comprising fluorinated compound.

The concentration of the hydrophilic resin in the solution described above is suitably in the range of 0.001 g/L to 100 g/L and preferably in the range of 0.1 g/L to 50 g/L. In addition, the same condition as used in the treatment with the aqueous solution comprising inorganic fluorinated compound described above is usable for the treatment with the hydrophilic resin.

Two or more kinds of the compounds selected from phosphorous compound, silicate and hydrophilic resin described above may be used.

Treatment with an Aqueous Solution Comprising Phosphorous Atom-containing Compound It is necessary that the surface of the aluminum substrate treated with an aqueous solution comprising phosphorous atom-containing compound satisfies the relationship represented by the formula: $0.05 \leqq A/(A+B) \leqq 0.70$ wherein, A represents peak area of phosphorous atom (2P) (counts·eV/sec) determined by X ray Electron Spectroscopy for Chemical Analysis, and B represents peak area of aluminum atom (2P) (counts·eV/sec) determined by X ray ESCA.

The term "ESCA" is as explained above.

In the present invention, when a peak area of phosphorous atom (2P) obtained by analyzing a surface of an aluminum substrate by ESCA is called as "A" (counts·eV/sec) and a peak area of aluminum atom (2P) obtained by analyzing a surface of an aluminum substrate by ESCA is called as "B" (counts·eV/sec), they satisfy the formula of $0.05 \leqq A/(A+B) \leqq 0.70$, preferably $0.07 \leqq A/(A+B) \leqq 0.50$, more preferably $0.10 \leqq A/(A+B) \leqq 0.40$, and most preferably $0.10 \leqq A/(A+B) \leqq 0.30$. If the ratio A/(A+B) is less than 0.05, the content of phosphorous atom-containing compound in the layer is too low to obtain a desired acid-proof or alkali-proof property. If the content of inorganic fluorinated compound in the layer is above 0.70, the adhesiveness of the substrate and the photosensitive layer becomes deteriorated.

Such substrate can be obtained by treating the substrate with phosphorous atom-containing compound after the surface of the substrate may be anodized. Preferable method is to form a layer comprising a phosphorous atom-containing compound on the substrate. In view of the durability and the effectiveness, the coating layer is preferably formed the layer on the anodized aluminum substrate after anodization.

Phosphorous atom-containing compound usable in the treatment of the substrate in the present invention is selected from the group consisting of phosphoric acid, phosphotungstic acid, phosphomolybdic acid, fluorophosphoric acid, phosphorous acid, hypophosphorous acid, polyphosphoric acid, metaphosphoric acid, and metal or ammonium salt thereof. Metal salts usable in the present invention include salts of alkali metal or alkaline earth metal. More specific examples thereof include zinc phosphate, aluminum phosphate, ammonium phosphate, dibasic ammonium phosphate, monobasic ammonium phosphate, monoammonium phosphate, monopotassium phosphate, monosodium phosphate, monobasic potassium phosphate, dibasic potassium phosphate, calcium phosphate, sodium ammonium phosphate, dibasic ammonium phosphate, magnesium hydrogenphosphate, magnesium phosphate, ferrous phosphate, ferric phosphate, monobasic sodium phosphate, sodium phosphate, dibasic sodium phosphate, lead phosphate, diammonium phosphate, monobasic calcium phosphate, lithium phosphate, phosphotungstic acid, ammonium phosphotungstate, sodium phosphotungstate, ammonium phosphomolybdate and sodium phosphomolybdate. Further, phosphorous acid, sodium phosphite, disodium hypophosphite, polyphosphoric acid such as diphosphoric acid and triphosphoric acid, sodium polyphosphate such as sodium triphosphate and hexasodium tetrapolyphosphate, hexasodium metaphosphate, sodium pyrophosphate, disodium monofluorophosphate, and potassium hexafluorophosphate are also preferred. Preferable examples are monobasic sodium phosphate, dibasic sodium phosphate, monobasic potassium phosphate and dibasic potassium phosphate. Most desirable one is the compound with hexametaphosphate anion, e.g., hexasodium hexametaphosphate (sodium hexametaphosphate). One or more of these compounds can be used.

Also, a compound comprising phosphonic acid group (phosphonic acid group-containing compound) can be used. For example, such compound includes 1-aminoalkane-1,1-diphosphonic acid. More specific examples are 1-aminoethane-1,1-diphosphonic acid and 1-amino-1-phenylmethane-1,1-diphosphonic acid. In addition, aminopolymethylene phosphonic acid, polyvinylphosphonic acid and the like can be used.

When the treatment with the phosphorous atom-containing compound is conducted, it may be possible to use an aqueous solution comprising such compound.

The amount of phosphate in the aqueous solution is suitably in the range of 1 g/L to 1000 g/L and preferably in the range of 50 g/L to 200 g/L.

One of the treating methods is to contact the plate with the solution having pH of 2 to 6 and preferably 3 to 5 at 25° C. at the temperature ranging from 10° C. to less than 100° C. and preferably from 30° C. to 90° C. for 1 second to 5 minutes and preferably from 5 seconds to 30 seconds. The contact can be performed by any known method such as immersion and spraying.

After the treatment with the aqueous solution comprising phosphorous atom-containing compound, in order to improve the adhesiveness of the substrate with the photosensitive layer, it is preferable to conduct a treatment with an acidic aqueous solution or to form a hydrophilic undercoating layer as described in J.P. KOKAI No. Hei 5-278362 or an organic layer as described in J.P. KOKAI No. Hei 4-282637 or Japanese Patent Application No. Hei 6-108678.

Also, in order to improve the hydrophilicity of the surface of the substrate, it is possible to treat the substrate with a hydrophilic compound before or after the treatment with the aqueous solution comprising phosphorous atom-containing compound. Specific examples of the hydrophilic compound include inorganic fluorinated compound, silicate, and hydrophilic resin.

In order to conduct the treatment with such hydrophilic compound, a mixture solution comprising a hydrophilic resin may be prepared by adding the hydrophilic resin to an aqueous solution comprising phosphorous atom-containing compound for the treatment, or the substrate may be treated with a solution comprising hydrophilic compound before or after the formation of the layer comprising phosphorous atom-containing compound.

Hereinafter, the hydrophilic compound will be detailed.

Preferable inorganic fluorinated compound is metal fluoride. Specific examples thereof include sodium fluoride, potassium fluoride, calcium fluoride, magnesium fluoride, strontium fluoride, barium fluoride, sodium hexafluorozirconate, potassium hexafluorozirconate, sodium hexafluorotitanate, potassium hexafluorotitanate, dihydrogen hexafluorozirconate (hexafluorozirconic acid), dihydrogen hexafluorotitanate (hexafluorotitanic acid), ammonium hexafluorozirconate, ammonium hexafluorotitanate, hexafluorosilicic acid, nickel fluoride, iron fluoride, fluorophosphoric acid, and ammonium fluorophosphate.

In order to conduct the treatment with such inorganic fluorinated compound, a mixture solution comprising an inorganic fluorinated compound may be prepared by adding the inorganic fluorinated compound to an aqueous solution comprising a phosphorous atom-containing compound for the treatment, or the substrate may be treated with a solution comprising hydrophilic resin before or after the formation of the layer comprising phosphorous atom-containing compound. The concentration of the inorganic fluorinated compound is suitably in the range of 0.1 g/L to 100 g/L and preferably in the range of 0.5 g/L to 20 g/L. In addition, the same condition as used in the treatment with the aqueous solution comprising phosphorous atom-containing compound described above is usable for the treatment with the inorganic fluorinated compound.

Also, to improve the hydrophilicity of the surface of the substrate, it is possible to treat with a silicate before or after the treatment with the phosphorous atom-containing compound to form a layer.

Such silicates usable in the treatment to improve the hydrophilicity of the substrate are sodium silicate, potassium silicate and lithium silicate.

In order to conduct the treatment with such silicate, a mixture solution comprising the silicate may be prepared by adding the silicate to the solution comprising phosphorous atom-containing compound for the treatment, or the substrate may be treated with an aqueous solution comprising silicate before or after the formation of the layer comprising phosphorous atom-containing compound.

The concentration of the silicate in the aqueous solution is suitably in the range of 0.1 g/L to 100 g/L and preferably in the range of 1 g/L to 50 g/L. In addition, the same condition as used in the treatment with the aqueous solution comprising phosphorous atom-containing compound described above is usable for the treatment with the silicate.

Also, to improve the hydrophilicity of the surface of the substrate, it is possible to treat with a hydrophilic resin before or after the treatment with the phosphorous atom-containing compound to form a layer.

Such hydrophilic resin usable in the treatment to improve the hydrophilicity of the substrate includes polyvinylphosphonic acid, polyvinylalcohol and CMC.

In order to conduct the treatment with such hydrophilic resin, a mixture solution comprising the hydrophilic resin may be prepared by adding the hydrophilic resin to the solution comprising phosphorous atom-containing compound for the treatment, or the substrate may be treated with an aqueous solution comprising hydrophilic resin before or after the formation of the layer comprising phosphorous atom-containing compound.

The concentration of the hydrophilic resin in the aqueous solution is suitably in the range of 0.001 g/L to 100 g/L and preferably in the range of 0.1 g/L to 50 g/L. In addition, the same condition as used in the treatment with the aqueous solution comprising phosphorous atom-containing compound described above is usable for the treatment with the hydrophilic resin.

Two or more kinds of compounds selected from inorganic fluorinated compound, silicate and hydrophilic resin may be utilized.

Aluminum Substrate

The substrates used for the production of the lithographic printing plate by the method of the present invention are dimensionally stable metal mainly comprising aluminum such aluminum or aluminum alloy. In addition to pure aluminum plate, an aluminum alloy plate comprising aluminum and a trace amount of other elements and paper or plastic films laminated with an aluminum film or on which aluminum is vapor-deposited are included. Also, a composite sheet comprising an aluminum sheet bound on a polyethylene terephthalate film as described in Japanese Patent Publication for Opposition Purpose (hereunder referred to as "J.P. KOKOKU") No. Sho 48-18327 can be used. Hereinafter, substrate made of aluminum or aluminum alloy described above will be referred to as aluminum substrate. Examples of the trace elements are silicon, iron, manganese, copper, magnesium, chromium, zinc, bismuth, nickel and/or titanium. The amount of the elements other than aluminum is at most 10% by weight. The aluminum substrate preferably used in the invention is a pure aluminum plate, but it is presently difficult to obtain a completely pure aluminum plate from the viewpoint of refining technique. Therefore, an aluminum plate containing other elements as low as possible is employed. The aluminum plate containing other elements in the order of the foregoing range can be used in the invention without any problem. In other words, the aluminum plates usable in the invention are not restricted to those having specific compositions and may be those commonly known and used in this art e.g., JIS A1050, JIS A1100, JIS A3103, and JIS A3005. The aluminum plate used in the invention has a thickness in the order of about 0.1 to 0.6 mm. The thickness can be altered depending on the size of printer, size of lithographic printing plate and the purpose.

Graining

Preferably, the substrate may be grained to form more preferable structure on the surface. The method for graining treatment of the substrate includes mechanical graining, chemical etching, electrolytic graining, as described in J.P. KOKAI No. Sho 56-28893. Further, it may be possible to use electrochemical graining method wherein the surface of the substrate is grained in an electrolyte, hydrochloric acid or nitric acid, and mechanical graining method such as wire brush graining wherein the surface of aluminum substrate is scrabbled with a metal wire, ball graining wherein the surface of aluminum substrate is grained with an abrasive particle and an abrasive material, and brush graining wherein the surface of the substrate is grained with a nylon brush and an abrasive. Each method can be used alone or in combination.

Among the above-described methods, useful method is an electrochemical surface graining to conduct graining in hydrochloric acid or nitric acid as an electrolyte. Suitable quantity of electricity at the anode ranges from 50 $C/dm^2$ to 400 $C/dm^2$. More specifically, the graining of the substrate is conducted under the following condition; in an electrolyte containing 0.1 to 50% of hydrochloric acid or nitric acid, temperature of 20 to 100° C., reaction time of 1 second to 30 minutes, current density of 1 to 200 $A/dm^2$ with direct or alternate current. Since it is easy to provide the surface with a fine asperity by the electrochemical graining, this method is also preferable to improve the adhesion between the photosensitive layer and the substrate.

By such graining method, it is possible to produce craters having a diameter of 0.5 to 20 $\mu$m or honeycomb-like pits on the surface of an aluminum plate in the area ratio of 30 to 100%. The pit reduces contamination in non-image area of the lithographic printing plate and improves printing durability. It is important to use enough amounts of electricity, i.e., total electricity obtained by multiplying electricity by the time for flowing of the electricity. In view of saving energy, less amount of electricity may be preferably used. The roughness of the surface after graining is preferably (Ra=) 0.2 to 0.7 $\mu$m.

Thus, optionally grained aluminum substrate may be preferably subjected to chemical etching with an acid or an alkali. As etching agent, acid is disadvantageous for the industrial application of the present invention because it takes so long time to destruct the fine structure of the surface. But it can be improved by use of alkaline agent as the etching agent. Examples of the alkaline agent preferably used in the present invention include sodium hydroxide, sodium carbonate, sodium aluminate, sodium metasilicate, sodium phosphate, potassium hydroxide, lithium hydroxide and the like. The preferable concentration of the alkaline agent and the temperature are from 1 to 50% and 20 to 100° C. Also, it is preferable to conduct the etching so that the amount of dissolution of Al ranges from 5 to 20 $g/m^3$. After etching, the plate may be washed with an acid to remove smut remained on the surface. Examples of acid used in the treatment include nitric acid, sulfuric acid, phosphoric acid, chromic acid, hydrofluoric acid, fluoboric acid and the like. Examples of the method for removing smut after electrochemical graining include, preferably, to contact the plate with 15 to 65% by weight of sulfuric acid at 50 to 90° C. as described in J.P. KOKAI No. Sho 53-12739, and to conduct alkaline etching as described in J.P. KOKOKU No. Sho 48-28123.

Anodization

In the method of the present invention, the aluminum substrate is subjected to anodization before it is treated with the aqueous solution containing nitrite group-containing compound, fluorine atom-containing compound, or phosphorous atom-containing compound. The substrate can be anodized by any method conventionally utilized in this field. More specifically, an anodized film can be formed on the surface of the aluminum substrate by passing a direct or alternating current therethrough in an electrolyte selected from sulfuric acid, phosphoric acid, chromic acid, oxalic acid, sulfamic acid, benzenesulfonic acid or mixture thereof. In this method, the electrolyte may comprise any component that is generally contained in Al alloy plate, electrode, supplied water, or groundwater. Further, the electrolyte may additionally comprise the second and the third components. In the present invention, the second and the third components include, for example, cation such as metal ions e.g., Na, K, Mg, Li, Ca, Ti, Al, V, Cr, Mn, Fe, Co, Ni, Cu, Zn and the like, and ammonium ion, and anion such as nitrate ion, carbonate ion, chloride ion, phosphate ion, fluoride ion, sulfite ion, titanate ion, silicate ion, borate ion and the like. The concentration of the ion may range from 0 to 10000 ppm. The conditions for the anodization variously vary depending on the kinds of the electrolytes selected, but in general the anodization is preferably performed at an electrolyte concentration ranging from 1 to 80% by weight, an electrolyte temperature ranging from −5 to 70° C., a current density ranging from 0.5 to 60 $A/dm^2$ and a voltage ranging from 1 to 100 V for 10 to 200 seconds. Among these anodization methods, particularly the method to anodize in sulfuric acid using high current density as described in British Patent No. 1,412,768 is preferred. In the present invention, the amount of the anodized layer is preferably 0.5 to 20 $g/m^2$. If it is less than 0.5 $g/m^2$, the resulting lithographic printing plate may have a damage, and if it is more than 20 $g/cm^2$, it needs a large amount of electric power during the production (that is, economical disadvantage). Preferably, the anodized layer is from 1.0 to 10 $g/m^2$, and more preferably from 1.5 to 6 $g/m^2$.

Intermediate Layer

In the present invention, it is possible to form a photosensitive layer or thermosensitive layer directly on the aluminum substrate which has been treated with the aqueous solution comprising at least one compound selected from the group consisting of nitrite group-containing compound, fluorine atom-containing compound and phosphorous atom-containing compound. However, if necessary, an intermediate layer may be formed on the substrate described above and then a photosensitive layer or thermosensitive layer may be formed thereon.

The intermediate layer can be formed by the following methods, but not limited thereto, e.g., dipping a solution, spraying, coating, evaporating, sputtering, ion plating, metallization, plating and the like. More specifically, for example, the intermediate layer can be formed by coating the layers described below on the substrate; a layer consisting of a compound having at least one amino group and a group selected from carboxyl group, salts thereof, sulfo group and salts thereof, as described in J.P. KOKAI No. Sho 60-149491; a layer consisting of a compound having at least one amino group and at least one hydroxy group or a salt of the compound as described in J.P. KOKAI No. Sho 60-232998; a layer comprising a salt of phosphoric acid as described in J.P. KOKAI No. Sho 62-19494; and a layer consisting of a polymer comprising at least one monomer having sulfo group as a repeat unit as described in J.P. KOKAI No. Sho 59-101651. Alternative method is to form a layer containing a compound selected from the group consisting of carboxymethylcellulose, dextrin, gum arabic, phosphonic acids containing amino group such as 2-aminoethylphosphonic acid, organic phosphonic acid such as optionally substituted phenylphosphonic acid, naphthylphosphonic acid, alkylphosphonic acid, glycerophosphonic acid, methylenediphosphonic acid and ethylenediphosphonic acid, an ester of organic phosphoric acid such as optionally substituted phenylphosphoric acid, naphthylphosphoric acid, alkylphosphoric acid and glycerophosphoric acid, organic phosphinic acid such as optionally substituted phenylphosphinic acid, naphthylphosphinic acid, alkylphosphinic acid and glycerophosphinic acid, amino acids such as glycine and β-alanine, and hydrochloric acid salt of hydroxy-containing amine compound such as triethanolamine.

Most desirable intermediate layer is that comprised of polymer compound comprising acid group and onium group, as shown below. Such intermediate layer may improve the properties relating to remaining of color, remaining of film and contamination without deteriorating the printing durability of the plate. Also, such intermediate layer may inhibit the formation of mud and sludge in the developer. In addition, when the thermosensitive layer is formed thereon, the sensitivity of the layer may be increased.

Intermediate Layer of Polymer Compound Comprising Acid Group and Onium Group

As a polymer compound utilized for formation of intermediate layer, a polymer comprising a structural unit having an acid group or acid group together with an onium group can be preferably used. Examples of such acid group in the structural unit of the polymer includes preferably acid group of which pKa (acid dissociation exponent) is 7 or less, more preferably —COOH, —$SO_3H$, —$OSO_3H$, —$PO_3H_2$, —$OPO_3H_2$, —$CONHSO_2$, and —$SO_2NHSO_2$— and most preferably —COOH. Examples of structural unit having preferred acid group include polymerizable compounds represented by the following formula (1) or (2).

(1)

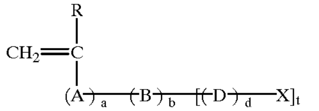

(2)

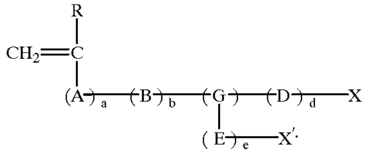

In the formula, A represents bivalent connecting group; B represents aromatic group or substituted aromatic group; D and E each independently represents bivalent connecting group; G represents trivalent connecting group; X and X' each independently represents acid group having pKa of 7 or less, or alkaline metal salt or ammonium salt thereof; R represents hydrogen atom, alkyl group or halogen atom; a, b, d, and e each independently represents 0 or 1; and t represents 1 to 3.

Preferable groups for the acid group described above are as follows; A represents —COO— or —CONH—, B represents phenylene group or substituted phenylene group, wherein the substituent is hydroxy group, halogen atom or alkyl group, D and E each independently represents alkylene group or bivalent connecting group of which molecular formula is $C_nH_{2n}O$, $C_nH_{2n}S$ or $C_nH_{2n+1}N$, G represents trivalent connecting group of which molecular formula is $C_nH_{2n-1}$, $C_nH_{2n-1}O$, $C_nH_{2n-1}S$ or $C_nH_{2n}N$, provided that n is 1 to 12, X and X' each independently represents carboxylic acid, sulfonic acid, phosphonic acid, sulfuric acid monoester or phosphoric acid monoester. R represents hydrogen atom or alkyl group. Each of a, b, d, and e independently represents 0 or 1, but a and b do not represent 0 at the same time.

Specifically preferred structural unit having acid group is that represented by general formula (1), wherein B represents phenylene group or phenylene group substituted by hydroxy group and/or $C_{1-3}$ alkyl group, D and E each independently represents $C_{1-2}$ alkylene group or $C_{1-2}$ alkylene group that is connected through oxygen atom, R represents hydrogen atom or methyl group, X represents carboxylic acid group, a is 0, and b is 1.

Specific examples of the unit having acid group include, but not limited thereto, acrylic acid, methacrylic acid, crotonic acid, isocrotonic acid, itaconic acid, maleic acid, maleic anhydride as well as the following ones.

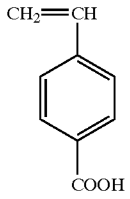
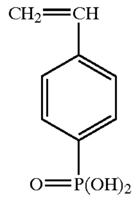
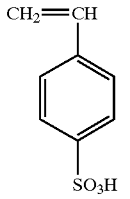
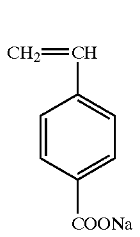
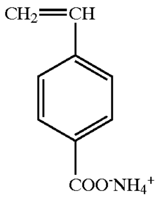
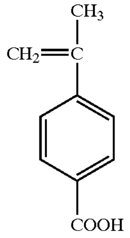
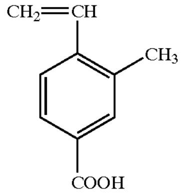
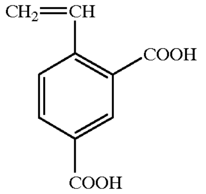
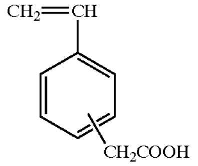
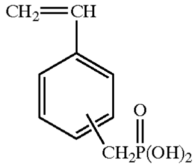
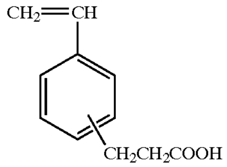
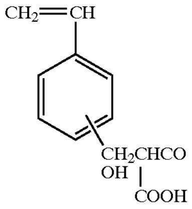
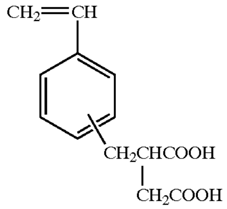
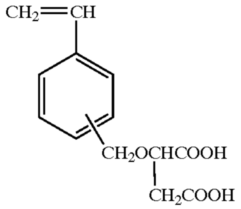
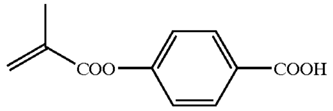
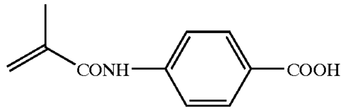
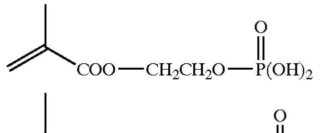
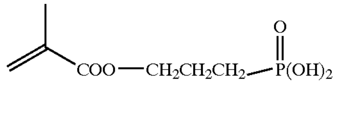

-continued

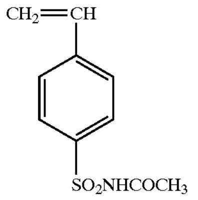

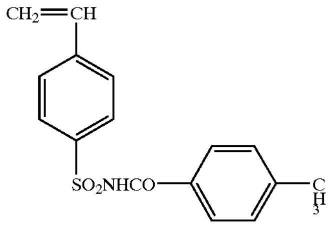

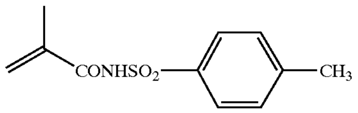

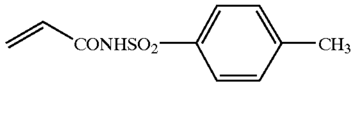

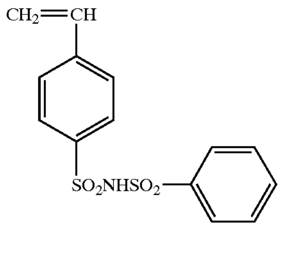

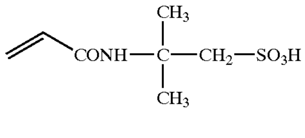

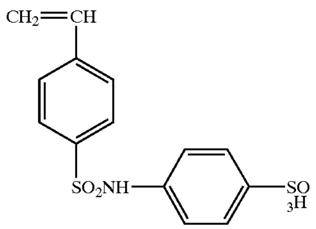

The structural unit having acid group as described above is used alone or in combination.

Preferred examples of onium group as a unit of polymer compound usable in the formation of the foregoing intermediate layer include those comprising atoms of group No. 5 or No. 6 on the periodic table, more preferably an onium group of nitrogen atom, phosphorus atom or sulfur atom, and most preferably an onium group of nitrogen atom. Also, as such polymer, those having as a main structure, vinyl type polymer such as acrylic resin, methacrylic resin and polystyrene or other polymers such as urethane resin, polyester or polyamide are preferred. Among them, more preferable polymers are vinyl type polymers having as a main structure acrylic resin, methacrylic resin and polystyrene. Most preferable polymers are those of which unit having onium group represented by the following general formula (3), (4) or (5).

(3)

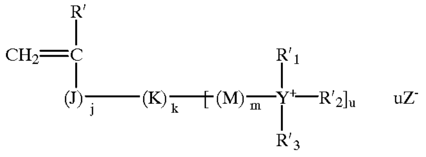

(4)

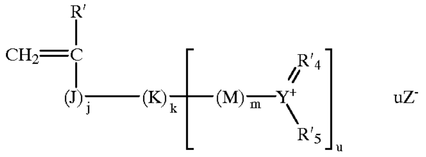

(5)

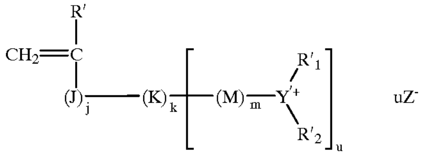

In the formula, J represents bivalent connecting group, K represents aromatic group or substituted aromatic group, M each independently represents bivalent connecting group, Y represents an atom of group No.5 of the periodic table, Y' represents an atom of group No.6 of the periodic table, $Z^-$ represents counter anion, R' represents hydrogen atom, alkyl group or halogen atom, $R'_1$, $R'_2$, $R'_3$, and $R'_5$ each independently represents hydrogen atom or optionally substituted alkyl group, aromatic group, or aralkyl group, $R'_4$ represents alkylidine group or substituted alkylidine, $R'_1$ and $R'_2$ or $R'_4$ and $R'_5$ may linked together to form a ring, j, k, and m each independently represents 0 or 1, and u is 1 to 3.

Preferable unit having onium group are those wherein J represents —COO— or —CONH—, K represents phenylene group or phenylene group substituted by hydroxy group, halogen atom and/or alkyl group, M represents alkylene group or bivalent connecting group of which molecular formula is $C_nH_{2n}O$, $C_nH_{2n}S$ or $C_nH_{2n+1}N$, provided that n is 1 to 12, Y represents nitrogen atom or phosphorus atom, Y' represents sulfur atom, $Z^-$ represents halogen ion, $PF_6^-$, $BF_4^-$ or $R'_6SO_3^-$, wherein $R'_6$ represents hydrogen atom or alkyl group, $R'_1$, $R'_2$, $R'_3$, $R'_5$ each independently represents hydrogen atom or optionally substituted $C_{1-10}$ alkyl group, aromatic group, aralkyl group, $R'_4$ represents $C_{1-10}$ alkylidine group or substituted alkylidine, and $R'_1$ and $R'_2$ or $R'_4$ and $R'_5$ may be liked together to form a ring, and j, k, m each independently represents 0 or 1 provided that j and k do not represent 0 at the same time.

Specifically preferred units having onium group are those wherein K represents phenylene group or phenylene group substituted by hydroxy group and/or $C_{1-3}$ alkyl group, M represents $C_{1-2}$ alkylene group or $C_{1-2}$ alkylene group connected through oxygen atom, $Z^-$ represents chloride ion or $R'_6SO_3^-$, $R'_6$ represents hydrogen atom or methyl group, j is 0 and k is 1.

Specific examples of the unit having onium group are as follows, but are not limited thereto.

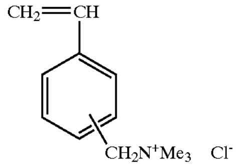
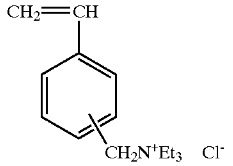
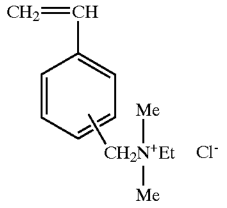
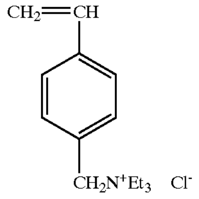
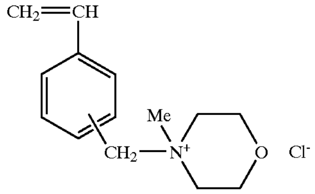
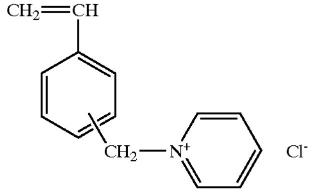
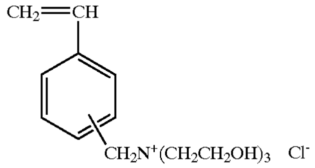
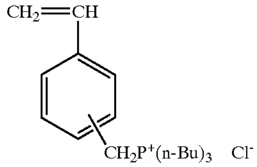
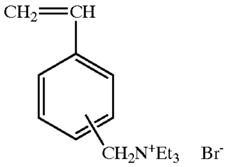
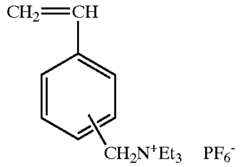
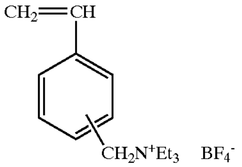

-continued

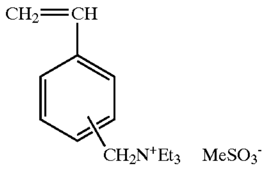
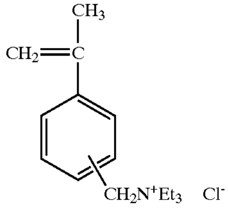
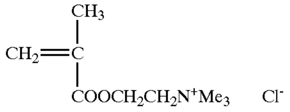
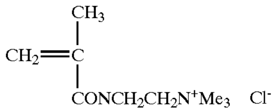
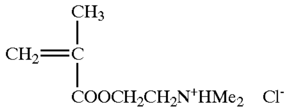
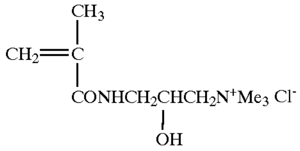

The polymer used for the formation of the intermediate layer desirably comprises 1 mol % or more, and preferably 5 mol % or more of the foregoing unit having onium group. When the polymer comprises 1 mol % or more of the unit having onium group, adhesiveness of the polymer improves. The unit having onium group may be used alone or in combination. In addition, two or more kinds of polymers having different units, different ratio of constituents, or different molecular weight can be used for the formation of the intermediate layer.

In addition, polymer compounds having acid group together with onium group comprises 20 mol % or more, and preferably 40 mol % or more of the unit having acid group and 1 mol % or more and preferably 5 mol % or more of unit having onium group. If the polymer compound contains 20 mol % or more of the unit having acid group, dissolution and removal of the non-image area upon alkaline development may be promoted. Also, adherence of the polymer may be improved due to synergistic effect of acid group and onium group. It is needless to say that two or more kinds of polymers having different units, ratio of constituents, or molecular weight can be used as the polymer compounds having onium group and acid group. Hereinafter, the representative examples of polymer compounds having onium group and acid group will be described. The ratio of constituents shown in the polymer structure means mol percent.

| | structure | molecular weight (Mw) |
|---|---|---|
| No. 1 | 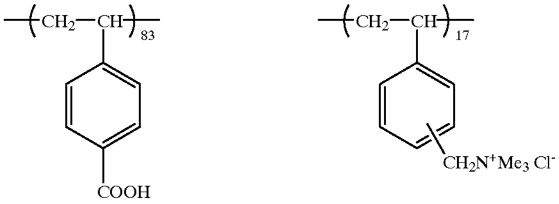 | 32000 |
| No. 2 |  | 28000 |
| No. 3 | 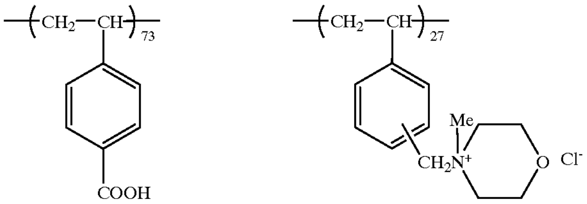 | 26000 |
| No. 4 | 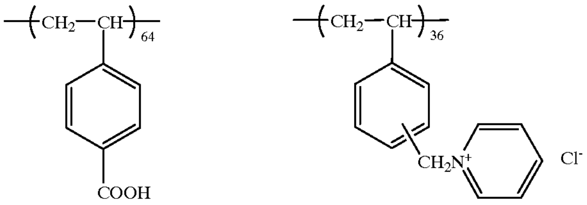 | 41000 |
| No. 5 | 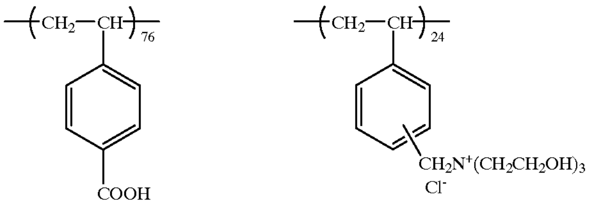 | 11000 |
| No. 6 | 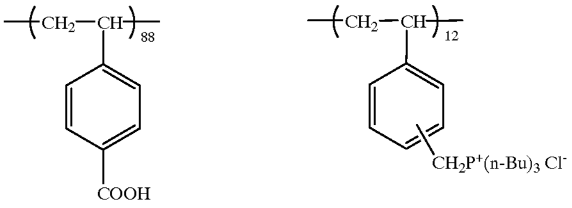 | 17000 |
| No. 7 | 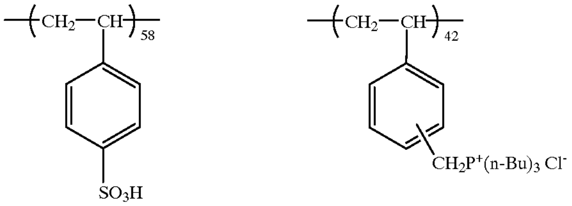 | 36000 |

-continued
| | structure | molecular weight (Mw) |
| --- | --- | --- |
| No. 8 |  | 22000 |
| No. 9 | 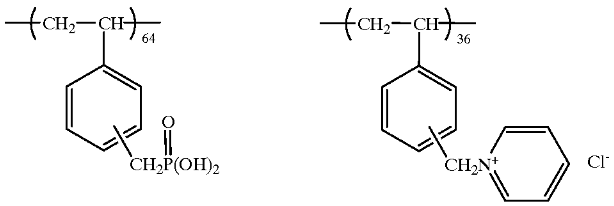 | 44000 |
| No. 10 | 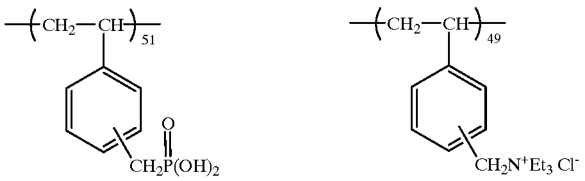 | 19000 |
| No. 11 |  | 28000 |
| No. 12 | 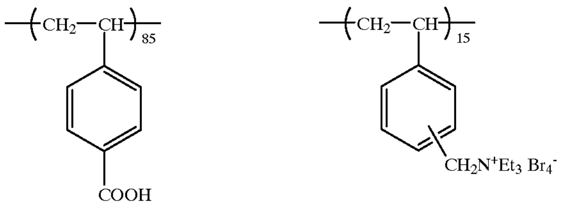 | 28000 |
| No. 13 | 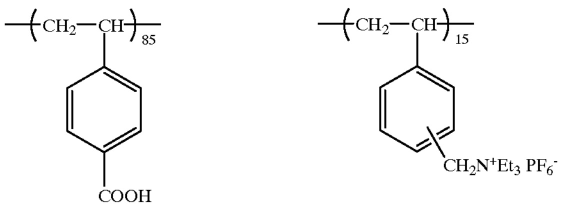 | 28000 |
| No. 14 | 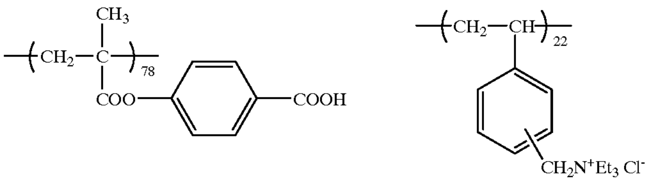 | 34000 |

-continued
| | structure | molecular weight (Mw) |
|---|---|---|
| No. 15 | 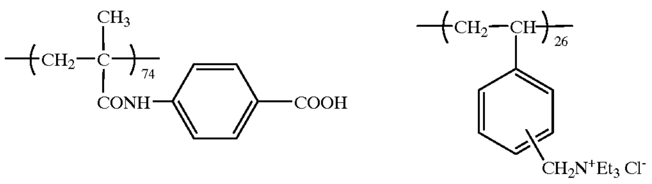 | 42000 |
| No. 16 | 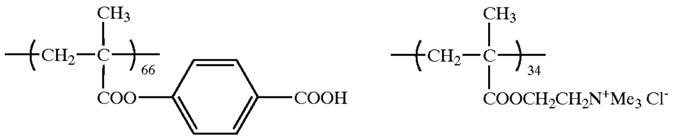 | 13000 |
| No. 17 | 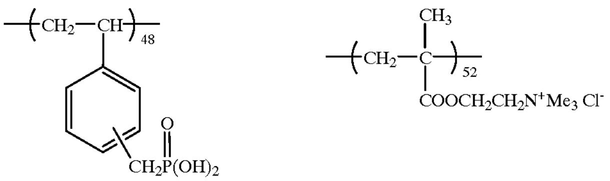 | 15000 |
| No. 18 | 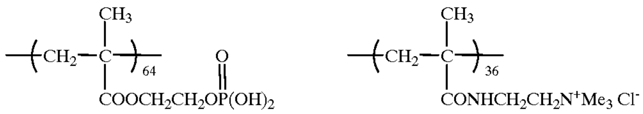 | 46000 |
| No. 19 | 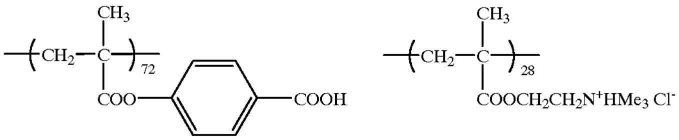 | 34000 |
| No. 20 | 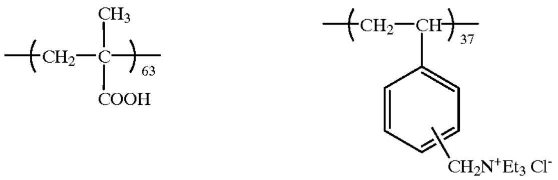 | 63000 |
| No. 21 | 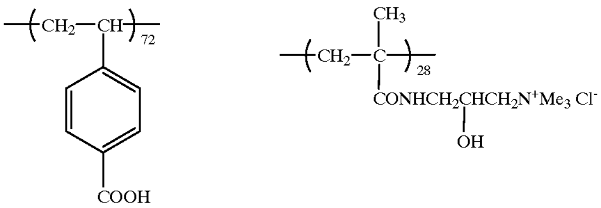 | 25000 |
| No. 22 | 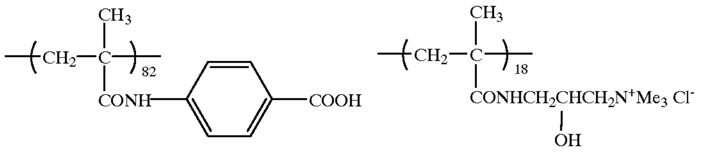 | 25000 |

-continued
| | structure | molecular weight (Mw) |
|---|---|---|
| No. 23 | 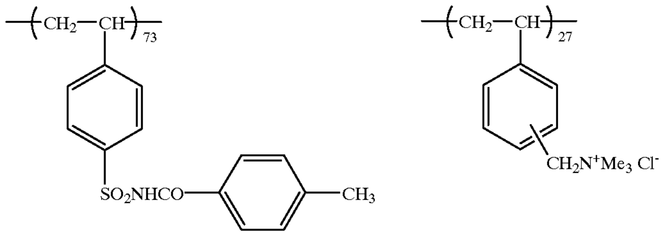 | 33000 |
| No. 24 | 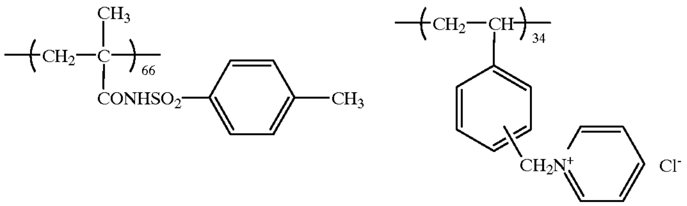 | 41000 |
| No. 25 | 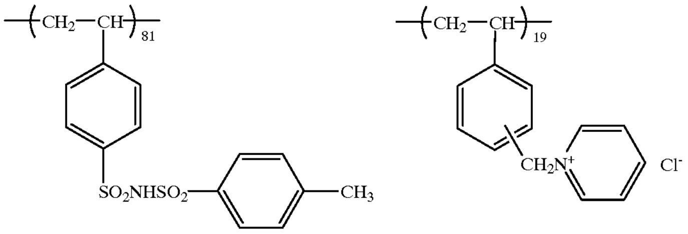 | 14000 |
| No. 26 | 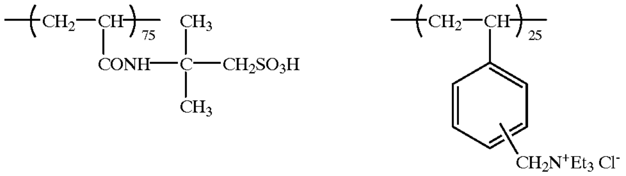 | 22000 |
| No. 27 | 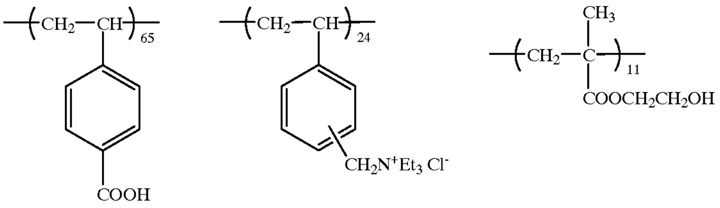 | 23000 |
| No. 28 | 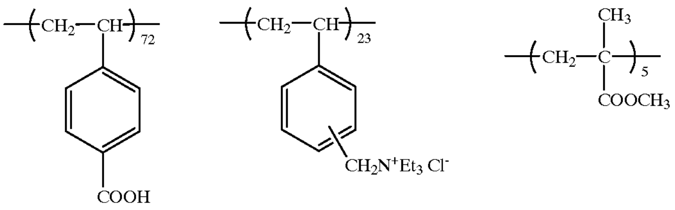 | 47000 |
| No. 29 | 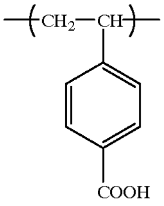 | 35000 |

The foregoing polymer compounds having acid group or acid group and onium group used for the formation of the intermediate layer can be generally prepared by radical chain polymerization method ("Textbook of Polymer Science" 3rd ed, (1984) F. W. Billmeyer, A Wiley-Interscience Publication). The molecular weight of these polymer compounds may be in a wide range, but preferably 500 to 2,000,000 and more preferably 2,000 to 600,000 (weight-average molecular weight, Mw, measured by the light scattering method). The amount of unreacted monomer in the polymer compounds may be in a wide range, but preferably 20% by weight or less and more preferably 10% by weight or less.

As one of the representative examples of the preparation of foregoing polymer compounds having acid group and onium group, a copolymer of p-vinylbenzoic acid and vinylbenzyltrimethylammonium chloride will be described. Paravinylbenzoic acid [Hokkyo Kagaku Kogyo Co. Ltd.] (146.9 g, 0.99 mol), vinylbenzyltrimethylammonium chloride (44.2 g, 0.21 mol) and 2-methoxyethanol (446 g) are taken into 1 L of three-neck flask and the mixture was heated to 75° C. and maintained at the temperature under nitrogen flow with stirring. Then 2,2-azobis(isobutyric acid) dimethyl (2.76 g, 12 mmol) was added to the mixture and stirring was continued. After 2 hours, 2,2-azobis(isobutyric acid) dimethyl (2.76 g, 12 mmol) was added. Further, after 2 hours, 2,2-azobis(isobutyric acid) dimethyl (2.76 g, 12 mmol) was added. After the mixture was stirred for 2 hours, it was then allowed to room temperature. This reaction solution was poured into 12 L of ethyl acetate under stirring. Precipitated solid was obtained by filtration and dried. The yielded amount was 189.5 g. The weight-average molecular weight (Mw) of thus obtained solid determined by light scattering method was 32,000. Other polymers can be also prepared similarly.

The intermediate layer having acid group and onium group can be formed by applying the foregoing polymer compounds having acid group and onium group (hereinafter, referred to as "polymer compounds") on an aluminum substrate which is pretreated with the foregoing aqueous solution comprising at least one compound selected from the group consisting of nitrite group-containing compound, fluorine atom-containing compound, or phosphorous atom-containing compound, and is optionally hydrophilic using a variety of methods. One of the methods utilized in the formation of intermediate layer is to coat a solution of the polymer compound in an organic solvent such as methanol, ethanol, methyl ethyl ketone and the like, mixture thereof or mixture of these organic solvent and water on an aluminum substrate followed by drying. Another method is to dip an aluminum substrate in a solution of the polymer compound in an organic solvent such as methanol, ethanol, methyl ethyl ketone and mixture thereof or mixture of these organic solvent and water so that the substrate adsorbs the polymer compound, followed by washing with water and drying. In the former method, a solution comprising 0.005 to 10% by weight of polymer compound can be coated on the substrate using a variety of methods, for example, bar coater coating, whirler coating, spray coating and curtain coating. In the latter method, the concentration of the solution ranges 0.01 to 20% by weight, preferably from 0.05 to 5% by weight, the temperature for dipping ranges 20 to 90° C., preferably 25 to 50° C., and the time for dipping ranges 0.1 second to 20 minutes, more preferably 2 seconds to 1 minute.

The pH of the foregoing solution of the polymer compound can be controlled by addition of basic materials such as ammonia, triethylamine, potassium hydroxide and the like, inorganic acid such as hydrochloric acid, phosphoric acid, sulfuric acid, nitric acid and the like, organic acidic material such as organic sulfonic acid, e.g., nitrobenzenesulfonic acid and naphthalenesulfonic acid, organic phosphonic acid, e.g., phenylphosphonic acid, organic carboxylic acid, e.g., benzoic acid, coumaric acid, malic acid and the like, organic acid chloride such as naphthalenesulfonylchloride, benzenesulfonylchloride and the like. The pH of the solution may range preferably from 0 to 12, and more preferably from 0 to 5. Also, yellow dye can be added to improve tone reproduction of the presensitized plate for preparing a lithographic printing plate. The amount of polymer compound coated on the substrate after dried is suitably from 2 to 100 mg/m$^2$, and preferably from 5 to 50 mg/m$^2$. If the amount is less than 2 mg/m$^2$, sufficient effect can not be obtained. When the amount is more than 100 mg/m$^2$, also the same problem would occur.

Also, an intermediate layer of polymer compound having acid group and onium group as described in J.P. KOKAI No. Hei 11-109637 may be utilized in the present invention.

Also, an intermediate layer comprising silane coupling agent having unsaturated group can be applied. Examples of such silane coupling agent include N-3-(acryloxy-2-hydroxypropyl)-3-aminopropyltriethoxysilane, (3-acryloxypropyl)dimethylmethoxysilane, (3-acryloxypropyl) methyldimethoxysilane, (3-acryloxypropyl) trimethoxysilane, 3-(N-allylamino)propyltrimethoxysilane, allyldimethoxysilane, allyltriethoxysilane, allyltrimethoxysilane, 3-butenyltriethoxysilane, 2-(chloromethyl)allyltrimethoxysilane, methacrylamidepropyltriethoxysilane, N-(3-methacryloxy-2-hydroxypropyl)-3-aminopropyltriethoxysilane, (methacryloxydimethyl)dimethylethoxysilane, methacryloxymethyltriethoxysilane, methacryloxymethyltrimethoxysilane, methacryloxypropyldimethylethoxysilane, methacryloxypropyldimethylmethoxysilane, methacryloxypropylmethyldiethoxysilane, methacryloxypropylmethyldimethoxysilane, methacryloxypropylmethyltriethoxysilane, methacryloxypropylmethyltrimethoxysilane, methacryloxypropyltris(methoxyethoxy) silane, methoxydimethylvinylsilane, 1-methoxy-3-(trimethylsiloxy)butadiene, styrylethyltrimethoxysilane, 3-(N-styrylmethyl-2-aminoethylamino)-propyltrimethoxysilane hydrochloride, vinyldimethylethoxysilane, vinyldiphenylethoxysilane, vinylmethyldiethoxysilane, vinylmethyldimethoxysilane, O-(vinyloxyethyl)-N-(triethoxysilylpropyl)urethane, vinyltriethoxysilane, vinyltrimethoxysilane, vinyltri-t-butoxysilane, vinyltriisopropoxysilane, vinyltriphenoxysilane, vinyltris(2-methoxyethoxy)silane, and diallylaminopropylmethoxysilane. Among them, a coupling agent preferably comprises methacryloyl group, acryloyl group, vinyl group, and/or allyl group, and particularly methacryloyl group and acryloyl group because unsaturated group in the groups shows rapid reactivity.

Additionally, the intermediate layer also can be prepared by any method selected from the following ones; a sol-gel coating method as described in J.P. KOKAI No. Hei 5-50779, a coating method of phosphonic acids as described in J.P. KOKAI No. Hei 5-246171, a coating method using materials for backcoating as described in J.P. KOKAI No. Hei 6-234284, J.P. KOKAI No. Hei 6-191173 and J.P. KOKAI No. Hei 6-230563, a method with phosphonic acids as described in J.P. KOKAI No. Hei 6-262872. a coating method as described in Hei 6-297875, a method for anodizing as described in J.P. KOKAI No. Hei 10-109480, and a dipping method as described in Japanese Patent Application Nos. Hei 10-252078 and No. Hei 10-253411.

Photosensitive Layer and Thermosensitive Layer

The following photosensitive layer or thermosensitive layer is formed on an aluminum substrate which is anodized and is treated with the foregoing aqueous solution comprising nitrite group-containing compound, fluorine atom-containing compound or phosphorous atom-containing compound after an intermediate layer is optionally formed.

Photosensitive Layer

The photosensitive layer used in the present invention includes both positive-working photosensitive layer and negative-working photosensitive layer. But the present invention especially effective for the positive-working photosensitive layer since it is often developed with a developer containing silicate. The positive-working or negative-working photosensitive layer can be formed by dissolving a positive-working or negative-working photosensitive composition in a suitable solvent and coating the solution on an aluminum substrate.

Examples of the positive-working photosensitive materials include any material of which solubility or swellability to a developer may change after exposure to light. Hereinafter, representative positive-working photosensitive materials will be explained, but the photosensitive materials utilized in the present invention are not limited thereto.

Positive-working Photosensitive Compound

Examples of positive-working photosensitive compound include o-quinonediazide compounds. Representative thereof includes o-naphthoquinonediazide compounds. Preferred o-naphthoquinonediazide compound is an ester of 1,2-diazonaphthoquinonesulfonyl chloride and pyrogallol-acetone resin as described in J.P. KOKOKU No. Sho 43-28403.

Other examples of preferred o-quinonediazide compound include an ester of 1,2-diazonaphthoquinonesulfonyl chloride and phenolformaldehyde resin as described in U.S. Pat. Nos. 3,046,120 and 3,188,210.

Further, useful o-naphthoquinonediazide compounds include those described in many patents and those known in the art. For example, they include compounds described in J.P. KOKAI Nos. Sho 47-5303, 48-63802, 48-63803, 48-96575, 49-38701, and 48-13354, J.P. KOKOKU Nos. Sho 37-18015, 41-11222, 45-9610, and 49-17481, J.P. KOKAI No. Hei 5-11444, 5-19477, 5-19478, and 5-107755, U.S. Pat. Nos. 2,797,213, 3,454,400, 3,544,323, 3,573,917, 3,674,495, and 3,785,825, U.K. Patent Nos. 1,227,602, 1,251,345, 1,267,005, 1,329,888, and 1,330,932, and German Patent No. 854,890.

Additionally, examples of other o-quinonediazide compound include o-naphthoquinonediazide compound prepared from 1,2-diazonaphthoquinonesulfonyl chloride and polyhydroxy compound having 1000 or less of molecular weight. For example, they include compounds described in J.P. KOKAI Nos. Sho 51-139402, 58-150948, 58-203434, 59-165053, 60-121445, 60-134235, 60-163043, 61-118744, 62-10645, 62-10646, 62-153950, 62-178562, and 64-76047, U.S. Pat. Nos. 3,102,809, 3,126,281, 3,130,047, 3,148,983, 3,184,310, 3,188,210, and 4,639.

In the preparation of these o-naphthoquinonediazide compounds, it is preferably to use 0.2 to 1.2 eq and more preferably 0.3 to 1.0 eq of 1,2-diazonaphthoquinonesulfonic acid chloride based on the amount of hydroxy group of polyhydroxy compounds. The 1,2-diazonaphthoquinone-sulfonic acid chloride may be preferably 1,2-diazo-naphthoquinone-5-sulfonic acid chloride but 1,2-diazonaphthoquinone-4-sulfonic acid chloride can be also utilized. The resulting o-naphthoquinonediazide compound is a mixture of products variously differing in the positions of 1,2-diazonaphthoquinonesulfonate groups and the amounts thereof introduced. But preferred are those having 5 mol % or more of the compound whose hydroxyl groups are all converted into 1,2-diazonaphthoquinonesulfonic acid esters (the completely esterified compound) based on the mixture, and more preferably those having 20 to 99 mol % of such compound.

Also, in place of o-naphthoquinonediazide compound, for example, the following compounds can be utilized as the positive-working photosensitive compound; a polymer compound comprising o-nitrocarbinol ester group as described in J.P. KOKOKU No. Sho 52-2696, pyridinium group-containing compound (J.P. KOKAI No. Hei 4-365049, etc.), or diazonium group-containing compound (J.P. KOKAI No. Hei 5-249664, J.P. KOKAI No. Hei 6-83047, J.P. KOKAI No. Hei 6-324495, J.P. KOKAI No. Hei 7-72621, etc.). In addition, a combination of a compound which photolytically generates acid (J.P. KOKAI No. Hei 4-121748, J.P. KOKAI No. Hei 4-365043, etc.) and a compound having C—O—C group or C—O—Si group that is dissociated in the presence of acid. Examples of such combination include, for example, a combination of a compound that photolytically generates acid and acetal or O, N-acetal compound (J.P. KOKAI No. Sho 48-89003, etc.), a combination with an ortho ester or amide acetal compound (J.P. KOKAI No. Sho 51-120714, etc.), a combination with a polymer having an acetal or a ketal group on the main chain (J.P. KOKAI No. Sho 53-133429, etc.), a combination with an enol ether compound (J.P. KOKAI No. Sho 55-12995, J.P. KOKAI No. Hei 4-19748, J.P. KOKAI No. Hei 6-230574, etc.), a combination with N-acylimino carbon compound (J.P. KOKAI No. Sho 55-126236, etc.), a combination of a polymer having an ortho ester group on the main chain (J.P. KOKAI No. Sho 56-17345, etc.), a combination with a polymer having silyl ester group (J.P. KOKAI No. Sho 60-10247, etc.), and a combination with a silyl ether compound (J.P. KOKAI No. Sho 60-37549, J.P. KOKAI No. Sho 60-121446, J.P. KOKAI No. Sho 63-236028, J.P. KOKAI No. Sho 63-236029, J.P. KOKAI No. Sho 63-276046, etc.). The photosensitive composition may comprise these positive-working photosensitive compound (including the combinations described above) in an amount ranging from 10 to 50% by weight and preferably from 15 to 40% by weight.

Binder for Photosensitive Composition

The photosensitive layer may comprise only o-quinonediazide compounds such as those listed above. But preferably, the o-quinonediazide compounds are used in combination with an alkaline water-soluble resin which is a binder.

Preferred examples thereof are alkaline water-soluble novolak resins such as phenol-formaldehyde resins and cresol-formaldehyde resins such as m- and p-cresol-formaldehyde resins, m-/p- mixed cresol-formaldehyde resins and phenol-mixed cresol (m-/p-/o- or m-/p- or m-/o-)-formaldehyde resins.

Preferable molecular weight of the alkaline soluble polymer compound ranges 500 to 100,000 by weight-average molecular weight. Also, resol type phenol resins are preferably utilized, among which phenol/cresol (m-, p-, o- or m-/p-/o-mixture) mixed formaldehyde resin is preferred and phenol resins described in J.P. KOKAI No. Sho 61-217034 is more preferred.

Other binders usable in the invention further include a variety of alkaline soluble polymer compounds such as phenol-modified xylene resins, polyhydroxystyrenes, halogenated polyhydroxystyrenes and acrylic resins having phenolic hydroxyl groups as disclosed in J.P. KOKAI No. Sho 51-34711, vinyl resin or urethane resin having sulfonamide group as described in J.P. KOKAI No. Hei 2-866, vinyl resins having a construction unit as described in J.P. KOKAI No. Hei 7-28244, J.P. KOKAI No. Hei 7-36184, J.P. KOKAI No. Hei 7-36185, J.P. KOKAI No. Hei 7-248628, J.P. KOKAI No. Hei 7-261394, and J.P. KOKAI No. Hei 7-333839. As vinyl resins, a film-forming resin having at least one compound selected from the following monomers (1) to (4) containing an alkaline soluble group, as a component for the polymer, is preferred;

(1) acrylamides, methacrylamides, acrylic esters, methacrylic esters or hydroxystyrenes having aromatic hydroxy group such as N-(4-hydroxyphenyl) acrylamide, N-(4-hydroxyphenyl)methacrylamide, o-, m- or p-hydroxystyrene, o- or m-bromo-p-hydroxystyrene, o- or m-chloro-p-hydroxystyrene, and o-, m- or p-hydroxyphenyl acrylate or methacrylate, (2) unsaturated carboxylic acid such as acrylic acid, methacrylic acid, maleic acid, maleic anhydride and half ester thereof, itaconic acid, itaconic anhydride and half ester thereof, (3) acrylamides such as N-(o-aminosulfonylphenyl) acrylamide, N-(m-aminosulfonylphenyl)acrylamide, N-(p-aminosulfonylphenyl)acrylamide, N-[1-(3-aminosulfonyl)naphthyl]acrylamide, and N-(2-aminosulfonylethyl)acrylamide, methacrylamides such as N-(o-aminosulfonylphenyl)methacrylamide, N-(m-aminosulfonylphenyl)methacrylamide, N-(p-aminosulfonylphenyl)methacrylamide, N-[1-(3-aminosulfonyl)naphthyl]methacrylamide, and N-(2-aminosulfonylethyl)methacrylamide, unsaturated sulfonamide of acrylic esters such as o-aminosulfonylphenyl acrylate, m-aminosulfonylphenyl acrylate, p-aminosulfonylphenyl acrylate, and 1-(3-aminosulfonylphenylnaphthyl) acrylate, unsaturated sulfonamide of methacrylic esters such as o-aminosulfonylphenyl methacrylate, m-aminosulfonylphenyl methacrylate, p-aminosulfonylphenyl methacrylate, and 1-(3-aminosulfonylphenylnaphthyl) methacrylate, and (4) optionally substituted phenylsulfonylacrylamide such as tosylacrylamide, and optionally substituted phenylsulfonylmethacrylamide such as tosylmethacrylamide.

Film-forming resins prepared by copolymerizing the following monomers described in (5) to (14), in addition to the monomers (1) to (4) containing alkaline soluble groups, may be preferably utilized;

(5) acrylic esters and methacrylic esters having aliphatic hydroxy group, for example, 2-hydroxyethyl acrylate or 2-hydroxyethyl methacrylate, (6) (substituted) acrylic ester such as methyl acrylate, ethyl acrylate, propyl acrylate, butyl acrylate, amyl acrylate, hexyl acrylate, cyclohexyl acrylate, octyl acrylate, phenyl acrylate, benzyl acrylate, 2-chloroethyl acrylate, 4-hydroxybutyl acrylate, glycidyl acrylate, and N-dimethylaminoethyl acrylate, (7) (substituted) methacrylic ester such as methyl methacrylate, ethylmethacrylate, propyl methacrylate, butyl methacrylate, amyl methacrylate, hexyl methacrylate, cyclohexyl methacrylate, octyl methacrylate, phenyl methacrylate, benzyl methacrylate, 2-chloroethyl methacrylate, 4-hydroxybutyl methacrylate, glycidyl methacrylate, and N-dimethylaminoethyl methacrylate, (8) acrylamides or methacrylamides such as acrylamide, methacrylamide, N-methylol acrylamide, N-methylolmethacrylamide, N-ethylacrylamide, N-ethylmethacrylamide, N-hexylacrylamide, N-hexylmethacrylamide, N-cyclohexylacrylamide, N-cyclohexylmethacrylamide, N-hydroxyethylacrylamide, N-hydroxyethylacrylamide, N-phenylacrylamide, N-phenylmethacrylamide, N-benzylacrylamide, N-benzylmethacrylamide, N-nitrophenylacrylamide, N-nitrophenylmethacrylamide, N-ethyl-N-phenylacrylamide and N-ethyl-N-phenylmethacrylamide, (9) vinyl ethers such as ethyl vinyl ether, 2-chloroethyl vinyl ether, hydroxyethyl vinyl ether, propyl vinyl ether, butyl vinyl ether, octyl vinyl ether, and phenyl vinyl ether,

(10) vinyl esters such as vinyl acetate, vinyl chloro acetate, vinylbutyrate, and vinyl benzoate,

(11) styrenes such as styrene, α-methylstyrene, methylstyrene, and chloromethylstyrene,

(12) vinyl ketones such as methyl vinyl ketone, ethyl vinyl ketone, propyl vinyl ketone, and phenyl vinyl ketone,

(13) olefins such as ethylene, propylene, isobutylene, butadiene, and isoprene, and

(14) N-vinyl pyrrolidone, N-vinylcarbazole, 4-vinylpyridine, acrylonitrile, methacrylonitrile and the like.

Preferable molecular weight of the alkaline soluble polymer compound ranges from 500 to 500,000 by weight-average molecular weight. Such alkaline soluble polymer compound can be used alone or in combination. Moreover, the amount of the aforementioned polymer in the photosensitive composition is 80% by weight or less, preferably 30 to 80% by weight and more preferably 50 to 70% by weight. Developability and durability of the obtained plate would be preferable when the amount of the polymer is within the range.

Further, it is preferred to additionally use a condensate of formaldehyde and phenol having C3–8 alkyl group as a substituent, such as t-butylphenolformaldehyde resin and octylphenolformaldehyde resin as described in U.S. Pat. No. 4,123,279, or o-naphthoquinonediazide sulfonate of these condensate (for example, as described in J.P. KOKAI No. Sho 61-243446) because the sensitivity to grease of the image may be improved.

Accelerator for Development

The photosensitive composition may preferably comprise cyclic acid anhydrides, phenols and organic acids in order to improve the sensitivity and developability. Examples of cyclic acid anhydrides include, as described in U.S. Pat. No. 4,115,128, phthalic anhydride, tetrahydrophthalic anhydride, hexahydrophthalic anhydride, 3,6-endoxy-Δ4-tetrahydrophthalic anhydride, tetrachlorophthalic anhydride, maleic anhydride, chloromaleic anhydride, α-phenylmaleic anhydride, succinic anhydride, pyromellitic anhydride and the like. Examples of phenols include bisphenol A, p-nitrophenol, p-ethoxyphenol, 2,4,4'-trihydroxybenzophenone, 2,3,4-trihydroxybenzophenone, 4-hydroxybenzophenone, 4,4',4"-trihydroxy-triphenylmethane, and 4,4',3",4"-tetrahydroxy-3,5,3',5'-tetramethyltriphenylmethane. In addition, examples of organic acids include sulfonic acids, sulfinic acids, alkylsulfuric acids, phosphonic acids, phosphate esters and carboxylic acids, as described in J.P. KOKAI No. Sho 60-88942, J.P. KOKAI No. Hei 2-96755. More specifically, such organic acids include p-toluenesulfonic acid, dodecylbenzenesulfonic acid, p-toluenesulfinic acid, ethyl sulfate, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 1,4-cyclohexene-2,2-dicarboxylic acid, erucic acid, lauric acid, n-undecanoic acid, ascorbic acid and the like. The amount of these cyclic acid anhydrides, phenols and organic acids in the photosensitive composition is preferably from 0.05 to 15% by weight and more preferably from 0.1 to 5% by weight.

Stabilizing Agent for Development

Further, the photosensitive composition may comprise nonionic surfactant as described in J.P. KOKAI No. Sho 62-251740 and J.P. KOKAI No. Hei 4-68355, amphoteric surfactant as described in J.P. KOKAI No. Sho 59-121044 and J.P. KOKAI No. Hei 4-13149 in order to improve the stability of the composition to the developing condition (that is, latitude for the development). Specific examples of nonionic surfactants include sorbitan tristearate, sorbitan monopalmitate, sorbitan trioleate, stearyl monoglyceride, polyoxyethylene sorbitan monooleate and polyoxyethylene nonyl phenyl ether and examples of amphoteric surfactants include alkyldi(aminoethyl)glycine, alkylpolyaminoethylglycine hydrochloride, 2-alkyl-N-carboxyethyl-N-hydroxyethyl imidazolinium betaine, an N-tetradecyl-N,N-betaine type surfactant (for example, trade name: Amorgen K, available from Dai-Ichi Kogyo Seiyaku Co., Ltd.), and an alkyl imidazoline type surfactant (for example, trade name: Rebon 15, available from Sanyo Chemical Industries, Ltd.). The content of the foregoing nonionic surfactants and/or amphoteric surfactants in the photosensitive composition preferably ranges from 0.05% to 15% by weight and more preferably 0.1% to 5% by weight.

Printing Out Agents, Dyes, and Other Additives

The photosensitive composition usable in the present invention may comprise a printing out agent for obtaining a visible image immediately after exposure to light, a dye or pigment for coloring images or other fillers. Examples of dyes usable in the present invention include basic dyes comprised of a salt of cation containing basic dye skeleton and organic anion comprising sulfonic acid group as a sole exchange group and 10 or more of carbon atoms with 1 to 3 hydroxy groups as described in J.P. KOKAI No. Hei 5-313359. The content of such compound in the whole photosensitive composition may be 0.2% to 5% by weight.

Also, it may be possible to add a compound that is photodegradable to produce a degradation product that interacts with the dyes as disclosed in J.P. KOKAI No. Sho 50-36209 (=U.S. Pat. No. 3,969,118) to change a color. Such compound may include o-naphthoquinonediazide-4-sulfonyl halogenide disclosed in J.P. KOKAI No. Sho 50-36209 (U.S. Pat. No. 3,969,118), trihalomethyl-2-pyrone and trihalomethyltriazine disclosed in J.P. KOKAI No. Sho 53-36223 (U.S. Pat. No. 4,160,671), various o-naphthoquinonediazide compound described in J.P. KOKAI No. Sho 55-62444 (U.S. Pat. No. 2,038,801), and 2-trihalomethyl-5-aryl-1,3,4-oxadiazole compound described in J.P. KOKAI No. Sho 55-77742 (U.S. Pat. No. 4,279,982). These compounds can be added alone or in combination. Among the compounds, a compound having absorption at 400 nm may be used as the foregoing yellow dye.

As a coloring agent for the image, other dyes than those described in J.P. KOKAI No. Hei 5-313359 can be used. Preferable dye including salt-formative organic dye are oil-soluble dye and basic dye. Specific examples thereof are Oil Green BG, Oil Blue BOS and #603 (they are all available from Orient Chemical Industries, Co., Ltd.), Victoria Pure Blue BOH, Victoria Pure Blue NAPS, Ethyl Violet 6HNAPS (they are all available from Hodogaya Chemical Co., Ltd.), Rhodamine B (CI 145170B), Malachite Green (C142000), and Methylene Blue (C152015).

The photosensitive composition may further comprise yellow dyes represented by the following general formula [I], [II] or [III] and having a characteristic that absorbance at 417 nm is 70% or more of the absorbance at 436 nm.

[I]

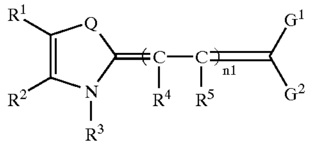

In formula [I], $R^1$ and $R^2$ each independently represents hydrogen atom, $C_{1-10}$ alkyl group, aryl group or alkenyl group. Also, $R^1$ and $R^2$ may form a ring. $R^3$, $R^4$, and $R^5$ each independently represents hydrogen atom or $C_{1-10}$ alkyl group. $G^1$ and $G^2$ each independently represents alkoxycarbonyl group, aryloxycarbonyl group, acyl group, arylcarbonyl group, alkylthio group, arylthio group, alkylsulfonyl group, arylsulfonyl group or fluoroalkylsulfonyl group. $G^1$ and $G^2$ may form a ring. In addition, at least one of $R^1$, $R^2$, $R^3$, $R^4$, $R^5$, $G^1$ and $G^2$ may comprise at least one group selected from sulfonic acid group, carboxyl group, sulfonamide group, imide group, N-sulfonylamide group, phenolic hydroxy group, sulfonamide group, or metal salt, inorganic or organic ammonium salt thereof. Q represents bivalent atomic group selected from O, S, NR (in which R is hydrogen atom, alkyl group or aryl group), Se, $—C(CH_3)_2—$, and —CH=CH—, and n1 is 0 or 1.

In formula [II], $R^6$ and $R^7$ each independently represents hydrogen atom, alkyl group, substituted alkyl group, aryl group, substituted aryl group, heterocyclic group, substituted heterocyclic group, allyl group or substituted allyl group, or $R^6$ and $R^7$ may be linked together to form a ring with carbon atom that is connected thereto, n2 is 0, 1 or 2, and $G^3$ and $G^4$ each independently represents hydrogen atom, cyano group, alkoxycarbonyl group, substituted alkoxycarbonyl group, aryloxycarbonyl group, substituted aryloxycarbonyl group, acyl group, substituted acyl group, arylcarbonyl group, substituted arylcarbonyl group, alkylthio group, arylthio group, alkylsulfonyl group, arylsulfonyl group, or fluoroalkylsulfonyl group, provided that $G^3$ and $G^4$ do not represent hydrogen atom at the same time. Also, $G^3$ and $G^4$ may be linked together to form a ring (consisting of nonmetal atoms) with carbon atom that is connected thereto. Further, at least one of $R^6$, $R^7$, $G^3$, and $G^4$ has at least one sulfonic acid group, carboxyl group, sulfonamide group, imide group, N-sulfonylamide group, phenolic hydroxy group, or sulfonamide group, or metal salt, inorganic or organic ammonium salt thereof.

[III]

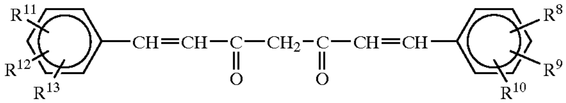

In formula [III], $R^8$, $R^9$, $R^{10}$, $R^{11}$, $R^{12}$ and $R^{13}$, each of which may be the same or different, represent hydrogen atom, alkyl group, substituted alkyl group, aryl group, substituted aryl group, alkoxy group, hydroxyl group, acyl group, cyano group, alkoxycarbonyl group, aryloxycarbonyl group, nitro group, carboxyl group, chloro group, or bromo group.

Negative-working Photosensitive Composition

Examples of negative-working photosensitive composition include those described in J.P. KOKAI No. Hei 10-020506, but they are not limited thereto.

Formation of Photosensitive Layer

The photosensitive layer can be obtained by coating on a substrate a solution of the aforementioned photosensitive composition in a solvent capable of dissolving the composition. Examples of solvent utilized in the present invention include γ-butyrolactone, ethylene dichloride, cyclohexanone methyl ethyl ketone, ethylene glycolmonomethyl ether, ethylene glycolmonoethyl ether, 2-methoxyethyl acetate, 1-methoxy-2-propanol, 1-methoxy-2-propyl acetate, toluene, ethyl acetate, methyl lactate, ethyl lactate, dimethylsulfoxide, dimethylacetamide, dimethylformamide, water, N-methylpyrrolidone tetrahydrofurfuryl alcohol, acetone, diacetone alcohol, methanol, ethanol, isopropanol, diethylene glycol dimethyl ether and the like, and these solvent can be used alone or in combination. Suitable concentration of photosensitive composition (solid content) ranges from 2 to 50% by weight. The coated amount of the photosensitive layer preferably ranges from 0.5 to 4.0 g/$m^2$. If the amount is less than 0.5 g/$m^2$, printing durability of the resulting printing plate will become lowered. If the amount is more than 4.0 g/$m^2$, although the printing durability improves, sensitivity to light becomes lowered. Also, the photosensitive layer can be formed by many known methods such as coating of a solution of photosensitive composition on a substrate.

The positive working photosensitive composition may comprise a surfactant. In the photosensitive composition, any surfactant to improve coating procedures for example fluorine atom-containing surfactant as described in J.P. KOKAI No. Sho 62-170950 can be used. Preferred amount thereof to be added ranges 0.01 to 1% by weight and preferably 0.005 to 0.5% by weight on the basis of the weight of photosensitive composition. Thus obtained lithographic printing plate provides an accurate print of original film, but with disadvantages such as defocus and roughness of the printed images. In order to prevent the defocus, the surface of the photosensitive layer may be treated to form asperity thereon. For example, J.P. KOKAI No. Sho 61-258255 discloses a method to coat a solution comprising photosensitive composition and particles with the size of several $\mu$ meter. But the effect of the method on the defocus is not so sufficient and the roughness of the printed images can not be improved.

Thermosensitive Layer

The thermosensitive layer usable in the present invention may include various kinds of known positive-working and negative-working thermosensitive image-forming composition can be used.

The thermosensitive image-forming composition includes those as described in, for example, J.P. KOKAI No. Hei 9-87245, J.P. KOKAI No. Hei 9-43845, J.P. KOKAI No. Hei 7-306528, and Japanese Patent Application No. Hei 10-229099. Hereinafter, examples of the thermosensitive image-forming composition will be described in detail, but they are not limited thereto.

Thermosensitive Image-forming Composition

The positive-working thermosensitive image-forming composition generally comprises (A) an infrared absorber and at least (B) an alkaline soluble polymer compound and (C) a compound that is compatible with the alkaline soluble polymer compound, which the compound decreases the solubility of the alkaline soluble polymer compound in an alkaline aqueous solution but increases the solubility upon heating.

A negative-working presensitized plate, in which the portion exposed to light is hardened to become image area, may further comprise (D) a compound which generates acid upon heating and (E) a cross-linking agent that cross-links the compounds in the presence of acid.

(A) Infrared Absorber

Infrared absorber (absorbent for infrared radiation, hereinafter, also referred to as "component (A)"), has a function to convert the absorbed infrared radiation to heat.

Preferable infrared absorber includes a dye or a pigment capable of absorbing infrared radiation at the wavelength ranging from 700 nm or more, and preferably at the wavelength ranging from 750 nm to 1200 nm efficiently. Further, a dye or a pigment having an absorption maximum at the wavelength ranging from 760 nm to 1200 nm is more preferable.

The foregoing dyes include commercially available dyes or known dyes described in references (for example, ⌈Senryo Benran (Handbook of dyes)⌋, edited by Society of organic synthetic chemistry, published on 1970). Specific examples thereof include azo dyes, metal complex salt azo dyes, pyrazolone azo dyes, naphthoquinone dyes, anthraquinone dyes, phthalocyanine dyes, carbonium dyes, quinonimine dyes, methine dyes, cyanine dyes, squarylium dye, pyrylium salt, metal thiolate complex and the like.

Among them, preferable examples are cyanine dyes as described in J.P. KOKAI No. Sho 58-125246, J.P. KOKAI No. Sho 59-84356, J.P. KOKAI No. Sho 59-202829, and J.P. KOKAI No. Sho 60-78787, methine dyes as described in J.P. KOKAI No. Sho 58-173696, J.P. KOKAI No. Sho 58-181690, and J.P. KOKAI No. Sho 58-194595, naphthoquinone dyes as described in J.P. KOKAI No. Sho 58-112793, J.P. KOKAI No. Sho 58-224793, J.P. KOKAI No. Sho 59-48187, J.P. KOKAI No. Sho 59-73996, J.P. KOKAI No. Sho 60-52940, and J.P. KOKAI No. Sho 60-63744, squarylium dyes as described in J.P. KOKAI No. Sho 58-112792, cyanine dyes as described in U.K. Patent No.434,875, and dihydropyrimidine squarylium dyes as described in U.S. Pat. No. 5,380,635.

In addition, the following additives are preferable; a sensitizer for near-infrared absorption as described in U.S. Pat. No. 5,156,938, substituted arylbenzo(thio)pyrylium salt as described in U.S. Pat. No. 3,881,924, trimethinethiapyrylium salt as described in J.P. KOKAI No. Sho 57-142645 (U.S. Pat. No. 4,327,169), pyryliums as described in J.P. KOKAI Nos. Sho 58-181051, 58-220143, 59-41363, 59-84248, 59-84249, 59-146063, and 59-146061, cyanine dyes as described in J.P. KOKAI No. Sho 59-216146, pentamethinethiopyrylium salt as described in U.S. Pat. No. 4,283,475, pyrylium compounds as described in J.P. KOKOKU Nos. Hei 5-13514 and 5-19702, and commercially available Epolight III-178, Epolight III-130, Epolight III-125 and Epolight IV-62A (manufactured by Epolin Company).

In addition, a near-infrared absorption dye represented by the formula (I) or (II) as described in U.S. Pat. No. 4,756,993 is also included as a preferable one.

Among the foregoing dyes, cyanine dyes, squarylium dyes, pyrylium salt, and nickel thiolate complex are preferred.

As the foregoing pigment, commercially available pigment or those described in Color Index (C.I.) handbook, ⌈Saishin Ganryo Benran (Handbook of current pigments⌋ (edited by Japan society of pigments technology), 1977), ⌈Saisin Ganryo Ouyou Gijutu (Current applied technology of pigments)⌋ (published by CMC, 1986), ⌈Insatu Ink Gijutu (Technology for printing ink)⌋ (published by CMC, 1984)

are included. Specific examples thereof include black, yellow, orange, brown, red, purple, blue, green, fluorescent, and metallic pigments as well as other polymer binding pigment.

More specifically, examples of the pigment include insoluble azo pigment, azo lake pigment, condensed azo pigment, chelating azo pigment, phthalocyanine pigment, anthraquinone pigment, perylene and perinone pigment, thioindigo pigment, quinacridone pigment, dioxadinone pigment, isoindolinone pigment, quinophthalone pigment, (staining lake pigment), azine pigment, nitroso pigment, nitro pigment, natural pigment, fluorescent pigment, inorganic pigment, carbon black and the like.

Among them, carbon black is preferred.

The foregoing pigment may be used without surface treatment or after surface treatment.

Such method for surface treatment includes a method for coating the surface with a resin or a wax, a method for coating a suifactant on the surface, or a method for binding a reactant (for example, silane coupling agent, epoxy compound, polyisocyanate and the like) on the surface of the pigment. These methods for surface treatment are described in ⌈Kinzoku Sekken no Seisitu to Ouyou (Property and application of metallic soap)⌋ published by Saiwai publisher), ⌈Technology for printing ink⌋ published by CMC, 1984) and ⌈Current applied technology of pigments⌋ (published by CMC, 1986).

The particle diameter of the foregoing pigment is preferably in the range of 0.01 $\mu$m to 10 $\mu$m, more preferably from 0.05 $\mu$m to 1 $\mu$m and most preferably from 0.1 $\mu$m to 1 $\mu$m.

If the particle diameter is less than 0.01 $\mu$m, a stability of a dispersed coating solution for photosensitive layer may be deteriorated. In contrast, if the particle diameter is above 10 $\mu$m, the uniformity of the image-forming layer may be deteriorated.

A method for dispersing the pigment can be selected from the conventional dispersion techniques such as the use of conventional disperser used for the preparation of ink or toner.

Examples of such disperser include ultrasonic disperser, sand mill, attritor, pearl mill, super mill, ball mill, impeller, disperser, KD mill, colloid mill, dynatron, tree roller mill, pressurized kneader and the like. Details thereof are described in ⌈Current applied technology of pigments⌋ (published by CMC, 1986).

The amount of the foregoing dye or pigment based on the total solid weight of image-forming layer is preferably in the range of 0.01 to 50% by weight and more preferably in the range of 0.1 to 10% by weight. In addition, the most preferable amount of dye is in the range of 0.5 to 10% by weight and the most preferable amount of pigment is in the range of 3.1 to 10% by weight.

If the amount is less than 0.01% by weight, the sensitivity of the layer may be deteriorated and if the amount is above 50% by weight, the uniformity of the image-forming layer is deteriorated to result in lowering of its durability.

The foregoing dye or pigment may added to the same layer with the other components or may added to a separate layer. When it is added to the separate layer, it is preferred to add to the next layer to the layer comprising component (C) described below.

In addition, it is preferred to add the dye and the pigment to the layer comprising the alkaline soluble polymer compound. But it may be possible to add to a separate layer.

(B) Alkaline Soluble Polymer Compound

As an alkaline soluble polymer compound (hereinafter, it may be referred to as "component (B)"), the following alkaline soluble polymer compound having an acidic group such as (1) to (3) at the main chain and/or side chain may be used.

(1) phenol group (—Ar—OH)

(2) sulfonamide group (—$SO_2$NH—R)

(3) acidic group with substituted sulfonamide (hereinafter, referred to as "active imide group".)

[—$SO_2$NHCOR, —$SO_2$NH$SO_2$R, —CONH$SO_2$R]

In the chemical formulas of groups (1) to (3), Ar means optionally substituted bivalent aryl connecting group, R represents optionally substituted hydrocarbon group.

Specific examples of the polymers having these groups will be described below. But they are not limited thereto.

(1) Specific examples of alkaline soluble polymer compound having phenol group include a novolak resin such as a condensation polymer of phenol and formaldehyde, a condensation polymer of m-cresol and formaldehyde, a condensation polymer of p-cresol and formaldehyde, a condensation polymer of m-/p-mixed cresol and formaldehyde, a condensation polymer of phenol and a condensation polymer of cresol (m-, p- or m-/p-mixed) and formaldehyde, or a condensation polymer of pyrogallol and acetone. Further, a polymer compound that is prepared by polymerizing monomer compound having phenol group at the side chain is also included.

Such polymer compound having phenolic hydroxy group at the side chain is a polymer compound of polymerizable low molecular monomer comprising at least one phenolic hydroxy group and at least one polymerizable unsaturated bond or a polymer compound obtained by copolymerizing said polymerizable monomer with other polymerizable monomer.

Examples of monomer having phenol group at the side chain include acrylamide, methacrylamide, acrylic ester, methacrylic ester and hydroxystyrene having phenol group at the side chain.

Specifically preferred examples of such monomer include N-(2-hydroxyphenyl)acrylamide, N-(3-hydroxyphenyl) acrylamide, N-(4-hydroxyphenyl)acrylamide, N-(2-hydroxyphenyl)methacrylamide, N-(3-hydroxyphenyl) methacrylamide, N-(4-hydroxyphenyl)methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrene, p-hydroxystyrene, 2-(2-hydroxyphenyl)ethyl acrylate, 2-(3-hydroxyphenyl)ethyl acrylate, 2-(4-hydroxyphenyl)ethyl acrylate, 2-(2-hydroxyphenyl)ethyl methacrylate, 2-(3-hydroxyphenyl)ethyl methacrylate, and 2-(4-hydroxyphenyl)ethyl methacrylate.

The molecular weight of the aforementioned alkaline soluble polymer compound having phenol group is preferably from $5.0\times10^2$ to $2.0\times10^5$ by weight-average molecular weight and from $2.0\times10^2$ to $1.0\times10^5$ by number-average molecular weight, in view of formation of images.

Also, the aforementioned alkaline soluble polymer compound having phenol group may be used alone or in combination of two or more of compounds. When the compounds are used in combination, a condensation polymer of t-butylphenol and formaldehyde, a condensation polymer of octylphenol and formaldehyde, or a condensation polymer of phenol having C3–8 alkyl group and formaldehyde as described in U.S. Pat. No. 4,123,279 may be further used.

The molecular weight of these condensation polymer ranges preferably from $5.0\times10^2$ to $2.0\times10^5$ by weight-average molecular weight and from $2.0\times10^2$ to $1.0\times10^5$ by number-average molecular weight.

An example of alkaline soluble polymer compound having (2) sulfonamide group is a polymer of which main monomer unit is a compound having a sulfonamide group, that is, a homopolymer thereof or copolymer with other polymeric monomer.

An example of such polymeric monomer having sulfonamide group includes a monomer prepared from a low molecular compound comprising in its molecular at least one sulfonamide group, $—SO_2—NH—$ in which at least one hydrogen atom is bound on nitrogen atom and at least one polymerizable unsaturated bond. Among such compounds, lower molecular compounds having acryloyl group, allyl group or vinyloxy group together with substituted or monosubstituted aminosulfonyl group or substituted sulfonylimino group are preferred.

Examples of such low molecular compounds include the following compounds of formula (a) to (e), but they are not limited thereto.

(a)

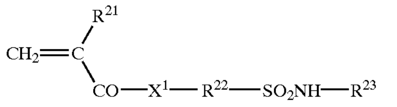

(b)

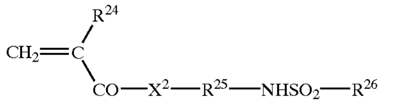

(c)

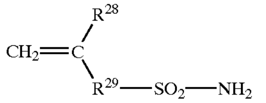

(d)

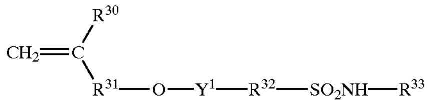

(e)

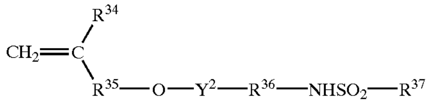

wherein, $X^1$ and $X^2$ each independently represents oxygen atom or $NR^{27}$; $R^{21}$ and $R^{24}$ each independently represents hydrogen atom or $CH_3$; $R^{22}$, $R^{25}$, $R^{29}$, $R^{32}$ and $R^{36}$ each independently represents optionally substituted $C_{1-12}$ alkylene group, cycloalkylene group, arylene group or aralkylene group; $R^{23}$, $R^{27}$ and $R^{33}$ each independently represents hydrogen atom, optionally substituted $C_{1-12}$ alkyl group, cycloalkyl group, aryl group or aralkyl group; $R^{26}$ and $R^{37}$ each independently represents optionally substituted $C_{1-12}$ alkyl group, cycloalkyl group, aryl group, aralkyl group; $R^{28}$, $R^{30}$ and $R^{34}$ each independently represents hydrogen atom or $CH_3$; $R^{31}$ and $R^{35}$ each independently represents single bond or optionally substituted $C_{1-12}$ alkylene group, cycloalkylene group, arylene group or aralkylene group; and $Y^1$ and $Y^2$ each independently represents single bond or CO.

Among these compounds, m-aminosulfonylphenyl methacrylate, N-(p-aminosulfonylphenyl)methacrylamide, and N-(p-aminosulfonylphenyl)acrylamide can be preferably utilized.

An example of alkaline soluble polymer compound having (3) active imide group is a polymer of which main monomer unit is a compound having an active imide group.

Examples of such polymer of which main monomer unit is a compound having an active imide group include a homopolymer of a low molecular compound having in its molecular structure at least one active imide group represented by the formula described below and at least one polymerizable unsaturated bond, or a copolymer of said monomer and other polymerizable polymeric monomer.

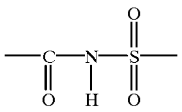

Specifically preferable examples of such compound include N-(p-toluenesulfonyl)methacrylamide, N-(p-toluenesulfonyl)acrylamide and the like.

Also, a polymer obtained by polymerizing at least two monomers selected from the group consisting of polymerizable monomers having phenol group, sulfonamide group and active imide group, or a polymer obtained by copolymerizing said at least two monomers together with other polymerizable monomers may be preferably used.

The ratio of polymerizable monomer having phenol group (M1), polymerizable monomer having sulfonamide group (M2) and/or polymerizable monomer having active imide group (M3) during the copolymerization thereof would be 50:50 to 5:95 (M1:M2 and/or M3; ratio of weight), preferably 50:50 to 5:95 and 40:60 to 10:90.

When the alkaline soluble polymer compound is a copolymer having monomer unit comprising a group selected from said acid groups (1) to (3) and other monomer unit, the copolymer preferably comprises at least 10 mol % and more preferably at least 20 mol % of monomer unit comprising a group selected from said acid groups (1) to (3). If the amount of said monomer unit is less than 10 mol %, sufficient alkaline solubility can not be obtained and thus, development latitude may become narrow.

For the preparation of the copolymer, conventionally known methods such as graft copolymerization, block copolymerization, or random copolymerization may be utilized.

The following monomers (a) to (l) can be utilized as the other polymerizable monomer unit used for the copolymerization of the monomer unit having a group selected from the acid groups (1) to (3), for example. But the monomer is not limited thereto.

(a) Acrylic esters, methacrylic esters having aliphatic hydroxy group, such as 2-hydroxyethyl acrylate and 2-hydroxyethyl methacrylate.

(b) Alkyl acrylate such as methyl acrylate, ethyl acrylate, propyl acrylate, butyl acrylate, amyl acrylate, hexyl acrylate, octyl acrylate, benzyl acrylate, 2-chloroethyl acrylate, glycidyl acrylate, and N-dimethylaminoethyl acrylate.

(c) Alkyl methacrylate such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, glycidyl methacrylate, and N-dimethylaminoethyl methacrylate.

(d) Acrylamide, or methacrylamide such as acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide, and N-ethyl-N-phenylacrylamide.

(e) Vinyl ethers such as ethyl vinyl ether, 2-chloroethyl vinyl ether, hydroxyethyl vinyl ether, propyl vinyl ether, butyl vinyl ether, octyl vinyl ether, and phenyl vinyl ether.

(f) Vinyl esters such as vinyl acetate, vinyl chloro acetate, vinyl butyrate, and vinyl benzoate.

(g) Styrenes such as styrene, α-methylstyrene, methylstyrene, and chloromethylstyrene.

(h) Vinyl ketones such as methyl vinyl ketone, ethyl vinyl ketone, propyl vinyl ketone, and phenyl vinyl ketone.

(i) Olefins such as ethylene, propylene, isobutylene, butadiene, and isoprene.

(j) N-Vinylpyrrolidone, N-vinylcarbazole, 4-vinylpyridine, acrylonitrile, methacrylonitrile and the like.

(k) Unsaturated imide such as maleimide, N-acryloylacrylamide, N-acetylmethacrylamide, N-propionylmethacrylamide, and N-(p-chlorobenzoyl) methacrylamide.

(l) Unsaturated carboxylic acids such as acrylic acid, methacrylic acid, maleic anhydride, and itaconic acid.

The foregoing alkaline soluble polymer compounds (irrespective of single polymer or copolymer) preferably has 2000 or more of weight-average molecular weight and 500 or more of number-average molecular weight and more preferably 5000 to 300000 of weight-average molecular weight, 800 to 250000 of number-average of molecular weight and 1.1 to 10 of dispersibility (weight-average molecular weight/number-average molecular weight), in view of the strength of the film.

When the alkaline soluble polymer compound is phenol-formaldehyde resin, cresol-aldehyde resin or the like, the weight-average molecular weight is preferably from 500 to 20000, and the number-average molecular weight is preferably from 200 to 10000.

The amount of the alkaline soluble polymer compound is preferably from 30 to 99% by weight, more preferably from 40 to 95% by weight and most preferably from 50 to 90% by weight, on the basis of the solid content of the image-forming layer.

If said amount is less than 30% by weight, the durability of the image-forming layer, and if the amount is higher than 99% by weight, the sensitivity and the durability may be lowered.

The foregoing polymer compound can be used alone or in combination.

(C) Compound having the Following Properties; the Compound is Compatible with the Alkaline Soluble Polymer Compound and thus it Makes the Solubility of the Alkaline Soluble Polymer Compound Decreased, but Such Property to Decrease the Solubility may be Reduced Upon Heating Component (C) shows good compatibility with the foregoing component (B) (alkaline soluble polymer compound) due to functional group in the molecule, which the group concerns to hydrogen bonding. Thus, a uniform solution for coating an image-forming layer can be prepared. Also, component (C) may interact with the alkaline soluble compound to result in preventing the alkaline-solubility of the alkaline soluble polymer compound (solubility preventing function).

In addition, the solubility preventing function for the alkaline-soluble polymer compound may be disappeared upon heating. But if the infrared absorber is such compound that is decomposed by heating, it may be impossible to sufficiently lower the solubility preventing function to result in decrease of sensitivity when sufficient energy for the decomposition of the agent can not be obtained because of less laser output or other conditions such as exposure time. Therefore, the thermolysis temperature of component (C) would be preferably 150° C. or higher.

For example, in view of the interaction with component (C) and alkaline soluble polymer compound (B), component (C) can be suitably selected from the group consisting of compounds capable of interacting with the foregoing alkaline soluble polymer compounds, such as sulfone compound, ammonium salt, phosphonium salt, amide compound and the like.

When a novolak resin is used alone as said component (B), component "(A+C)" described below is preferred and cyanine dye A described below is more preferred. Component "(A+C)" will be described hereinafter.

The ratio between component (C) and alkaline soluble polymer compound (B) (C/B) is preferably from 1/99 to 25/75.

If the ratio is less than 1/99, that is, component (C) is not enough, component (C) can not interact with the alkaline soluble polymer compound. As the result, image can not be formed in good condition. If component (C) is over 25/75, that is, component (C) is too much, the interaction would be excessive. As the result, the sensitivity may be lowered.

Component (A+C)

In place of the foregoing components (A) and (C), a compound having properties of both the components may be used.

Component (A+C) is a basic dye that has a property to generate a heat upon absorbing light (that is, property of component (A)) and an absorption band at 700 to 1200 nm and is compatible with the alkaline soluble polymer compound.

Component (A+C) may comprise a group that interacts with the alkaline soluble polymer compound, such as ammonium group, imminium group and the like. Therefore, component (A+C) may interact with the polymer compound to result in preventing alkaline solubility.

Examples of the foregoing component (A+C) include the compounds represented by the following general formula (Z).

(Z)

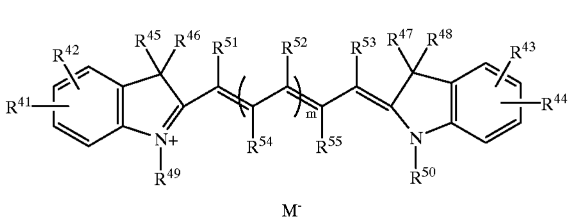

In formula (Z), $R^{41}$ to $R^{44}$ each independently represents hydrogen atom, or optionally substituted $C_{1-12}$ alkyl group, alkenyl group, alkoxy group, cycloalkyl group, aryl group, and $R^{41}$ and $R^{42}$ or $R^{43}$ and $R^{44}$ may be linked together to form a cyclic structure.

Specific examples of $R^{41}$ to $R^{44}$ include hydrogen atom, methyl group, ethyl group, phenyl group, dodecyl group, naphthyl group, vinyl group, allyl group, cyclohexyl group and the like and these groups may be optionally substituted. Examples of substituents include halogen atom, carbonyl group, nitro group, nitrile group, sulfonyl group, carboxyl group, carboxylic acid ester, sulfonic acid ester and the like.

In the formula, $R^{45}$ to $R^{50}$ each independently represents optionally substituted $C_{1-12}$ alkyl group, and specific examples of $R^{45}$ to $R^{50}$ include methyl group, ethyl group, phenyl group, dodecyl group, naphthyl group, vinyl group, allyl group, cyclohexyl group and the like. Further, these group may be optionally substituted. Examples of substituents include halogen atom, carbonyl group, nitro group, nitrile group, sulfonyl group, carboxyl group, carboxylic acid ester, sulfonic acid ester and the like.

In the formula, $R^{51}$ to $R^{53}$ each independently represents hydrogen atom, halogen atom, or optionally substituted $C_{1-8}$ alkyl group, and $R^{52}$ may be linked to $R^{51}$ or $R^{53}$ to form a cyclic structure. In the case that m>2, plural $R^{52}$ may be linked together to form a cyclic structure.

Examples of $R^{51}$ to $R^{53}$ include chlorine atom, cyclohexyl group, cyclopentyl ring or cyclohexyl ring (when plural $R^{52}$ are linked together) and these groups may have a substituent. Examples of substituent include halogen atom, carbonyl group, nitro group, nitrile group, sulfonyl group, carboxyl group, carboxylic acid, sulfonic acid and the like.

"m" is 1 to 8 and preferably 1 to 3.

In the formula, $R^{54}$ to $R^{55}$ each independently represents hydrogen atom, halogen atom, or optionally substituted $C_{1-8}$ alkyl group, $R^{54}$ may be linked to $R^{55}$ to form a cyclic structure. In the case that m>2, plural $R^{54}$ may be linked together to form a cyclic structure.

Examples of $R^{54}$ to $R^{55}$ include chlorine atom, cyclohexyl group, cyclopentyl ring or cyclohexyl ring (when plural $R^{52}$ are linked together) and these groups may have a substituent. Examples of substituent include halogen atom, carbonyl group, nitro group, nitrile group, sulfonyl group, carboxyl group, carboxylic acid, sulfonic acid and the like.

"m" is 1 to 8 and preferably 1 to 3.

In the formula, $M^-$ is anion, i.e., perchlorate, tetrafluoroboric acid, hexafluorophosphoric acid, triisopropylnaphthalenesulfonic acid, 5-nitro-O-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, 1-naphthol-5-sulfonic acid, 2-methoxy-4-hydroxy-5-benzoyl-benzenesulfonic acid and paratoluenesulfonic acid are included.

Among them, alkyl aromatic sulfonic acid such as hexafluorophosphoric acid, triisopropylnaphthalenesulfonic acid, and 2,5-dimethylbenzenesulfonic acid are preferred.

The compounds represented by the general formula (Z) are generally called as cyanine dye. Examples of the compounds include the following compounds, but not limited thereto.

cyanine dye A

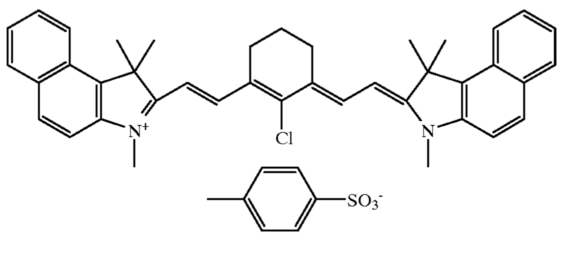

-continued cyanine dye B

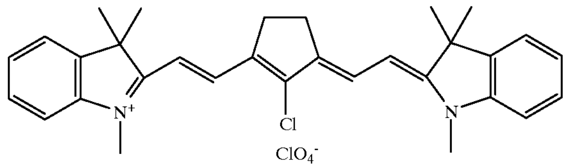

cyanine dye C

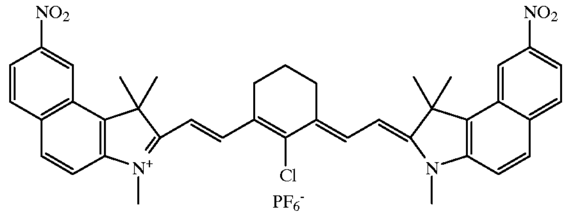

cyanine dye D

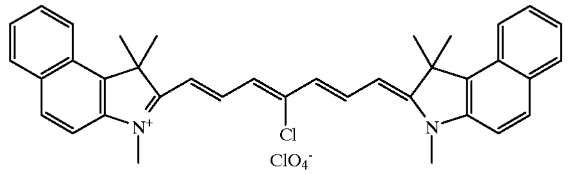

cyanine dye E

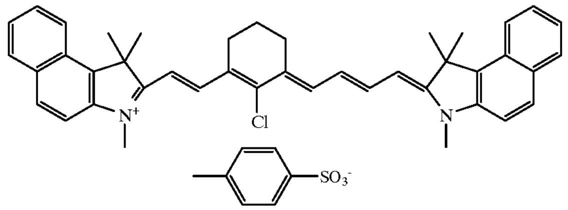

In the case that component (A+C) has properties of both components (A) and (C) is used in place of components (A) and (C), the ratio between component (A+C) and component (B) ([(A+C)/(B)]) is preferably 1/99 to 30/70, and more preferably 1/99 to 25/75.

Hereinafter, components for negative-working thermosensitive image-forming composition will be described.

(D) Compounds That Generates an Acid Upon Heating

In the case that an image-forming material is negative-working one, a compound that generates acid upon heating (hereinafter, referred to as "acid-generating agent") can be additionally used. The acid-generating agent may increase compounds that generate acid upon heating at 100° C. or higher. The acid generated by the compound is preferably strong acid having pKa at 2 or below such as sulfonic acid, hydrochloric acid and the like.

Examples of said acid-generating agent include those described in Japanese Patent Application No. Hei 11-66733.

The amount of the acid-generating in the solid amount of image-forming layer is preferably from 0.01 to 50% by weight, more preferably from 0.1 to 40% by weight and most preferably 0.5 to 30% by weight.

(E) Cross-linking Agent for Cross-linking Reaction with Acid

In the case that the lithographic printing plate is negative-working type, a cross-linking agent for cross-linking reaction with an acid (hereinafter, just referred to as "cross-linking agent") can be additionally used.

Examples of said cross-linking agent include the following compounds.

(i) Aromatic compounds having substituents such as alkoxymethyl group or hydroxymethyl group (ii) Compounds having N-hydroxymethyl group, N-alkoxymethyl group or N-acyloxymethyl group (iii) Epoxy compounds In addition, compounds described in J.P. KOKAI No. Hei 11-254850 and phenol derivatives are also included.

The amount of said cross-linking agent on the total solid weight in the image-forming layer is preferably from 5 to 80% by weight, more preferably from 10 to 75% by weight, and most preferably from 20 to 70% by weight.

When said phenol derivatives are used as the cross-linking agent, the amount of the phenol derivative based on the total solid weight in the image-forming material is preferably from 5 to 70% by weight, and more preferably from 10 to 50% by weight.

The details of each compound described are disclosed in Japanese Patent Application No. Hei 11-66733.

Other Components

The image-forming layer of the lithographic printing plate that is suitably treated with an alkaline developer may optionally comprise various additives.

For example, in order to improve sensitivity of the image-forming layer, known additives such as cyclic anhydrides, phenols, organic acids, sulfonyl compounds and the like can be added.

The amount of the foregoing cyclic anhydrides, phenols, organic acids or sulfonyl compounds based on the total solid weight in the image-forming layer is preferably from 0.05 to 20% by weight, more preferably from 0.1 to 15% by weight, and most preferably from 0.1 to 10% by weight.

In order to improve the stability to the developing condition, nonionic surfactant described in J.P. KOKAI No. Sho 62-251740, and J.P. KOKAI No. Hei 3-208514, and amphoteric surfactant described in J.P. KOKAI No. Sho 59-121044 and J.P. KOKAI No. Hei 4-13149.

The amount of said nonionic surfactant or amphoteric surfactant on the basis of the total solid weight in the image-forming layer is preferably from 0.05 to 15% by weight, and more preferably 0.1% by weight.

The image-forming layer in the present invention may comprise a printing out agent for obtaining a visible image immediately after exposure to light and a dye or pigment for coloring images.

A representative example of the printing out agent is a combination of a photosensitive compound capable of releasing an acid through exposure to light with a salt-forming organic dye. More specifically, a combination of o-naphthoquinonediazido-4-sulfonic acid halide with a salt-forming organic dye as disclosed in J.P. KOKAI Nos. Sho 50-36209 and Sho 53-8128; and a combination of a trihalomethyl compound with a salt-forming organic dye as disclosed in J.P. KOKAI Nos. Sho 53-36223, Sho 54-74728, Sho 60-3626, Sho 60-138539, Sho 61-143748, Sho 61-151644 and Sho 63-58440. Such trihalomethyl compounds include oxadiazole and triazine type compounds and both of these are excellent in stability with time and can provide clear printed out images.

Other dyes may also be used instead of or together with the foregoing salt-forming organic dyes as the agents for coloring images. Preferred dyes inclusive of the salt-forming organic dyes are, for instance, oil-soluble and basic dyes. Specific examples thereof are Oil Yellow #101 and #103, Oil Pink #312, Oil Green BG, Oil Blue BOS and #603, Oil Black BY, BS and T-505 (they are all available from Orient Chemical Industries, Co., Ltd.), Victoria Pure Blue, Crystal Violet (CI 42555), Methyl Violet (CI 42535), Ethyl Violet, Rhodamine B (CI 145170B), Malachite Green (CI 42000) and Methylene Blue (CI 52015). Particularly preferred are those disclosed in J.P. KOKAI No. Sho 62-293247.

The amount of said dye on the basis of total solid weight of image-forming layer is preferably from 0.01 to 10% by weight and more preferably from 0.1 to 3% by weight.

Also, the image-forming layer in the present invention may optionally comprise a plasticizer for improving the flexibility of the resulting coating layer.

Examples of the plasticizer include butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, oligomer and polymer of acrylic acid or methacrylic acid and the like.

The image-forming layer of the present invention may optionally comprise the following various additives.

For example, a compound that is pyrolytic and makes the solubility of the alkaline water-soluble polymer compound substantially lowered before pyrolysis, can be added. It is preferred to add such compounds because such compounds prevent the image area from dissolving into a developer.

The amount of said onium salt, o-quinonediazide compounds, aromatic sulfonic acid ester based on the solid weight of image-forming layer is preferably from 0.1 to 50% by weight, more preferably from 0.5 to 30% by weight and most preferably from 0.5 to 20% by weight.

Light-exposure

The presensitized plate having photosensitive or heat-sensitive layer of the invention are subjected to imagewise exposure to light and a subsequent development process. The imagewise exposure to light may be performed using various sources for actinic light rays such as a carbon arc lamp, a mercury lamp, a metal halide lamp, a xenon lamp, a tungsten lump, and a chemical lamp. Radiant rays may likewise be used for the imagewise exposure process and examples of the radiant rays include electron beam, X-rays, ion beam and far-infrared radiation. In addition, g-rays, i-rays and Deep-UV rays, high density energy beams (such as laser beams or electron beams) may likewise be used in the present invention. Examples of such laser beams include those emitted from He—Ne lasers, argon lasers, krypton ion lasers, He—Cd lasers, KrF excimer lasers, semiconductor lasers and YAG lasers.

Development

Hereinafter, development process of the present invention will be described.

A developer used in the method of the present invention does not comprise silicate. Preferable developer is an aqueous alkaline solution that does not substantially comprise organic solvent. Specific examples of the suitable developer include an aqueous solution of NaOH, KOH, LiOH, tribasic sodium phosphate, dibasic sodium phosphate, tribasic ammonium phosphate, dibasic ammonium phosphate, sodium carbonate, sodium bicarbonate, potassium carbonate and ammonia. More preferable developer is that comprising (a) at least one sugar selected from non-reducing sugars and (b) at least one base and having pH at 9.0 to 13.5. Hereinafter, details of the developer will be described. In the present specification, in the absence of particular mention, "developer" means a developer to be used for initiating development process (developer in strict meaning) and replenisher.

Non-reducing Sugars and Bases

The developer comprises, as main components, at least one compound selected from non-reducing sugars and at least one base and has pH in a range of 9.0 to 13.5. Such non-reducing sugar does not comprise free aldehyde group or ketone group and thus, does not show reducing property. Such non-reducing sugar is categorized into trehalose-type oligosaccharides in which reducing groups arc connected together, glycosides comprised of saccharides of which reducing group is connected to non-sugar compounds, and sugar alcohols prepared by hydrogenation of saccharides, and every kinds of non-reducing sugar can be suitably used. Examples of trehalose-type oligosaccharides include saccharide and trehalose. Examples of glycosides include alkyl glycosides, phenol glycosides, mustard oil glycosides and the like. Examples of sugar alcohols include D,L-arabitol, ribitol, xylitol, D,L-sorbitol, D,L-mannitol, D,L-iditol, D,L-talitol, dulcitol and allodulcitol. In addition, examples of non-reducing sugars include maltitol prepared by hydrogenation of disaccharides and reductant (reduced glucose) prepared by hydrogenation of oligosaccharides. Among these non-reducing sugars, sugar alcohols and saccharoses are particularly preferred. Further, D-sorbitol, saccharide, reduced glucose are preferred because these compounds indicate buffer action at suitable pH range and are inexpensive. These non-reducing sugars can be used alone or in combination. The amount of the non-reducing sugars on the basis of developer is preferably from 0.1 to 30% by weight and more preferably from 1 to 20% by weight. If the amount is less than said range, sufficient buffer action can not be obtained. If the amount is above the range, it is difficult to concentrate to high concentration and also, the cost would become higher. In addition, when a reducing sugar and a base is used in combination, the color of the resulting developer may change to brown with time and pH of the developer may become gradually lower to result in deteriorating of developability.

As a base for use in combination with non-reducing sugar, conventionally known alkaline agents other than silicate can be used. Examples of such base include inorganic alkaline agent such as sodium hydroxide, potassium hydroxide, lithium hydroxide, trisodium phosphate, tripotassium phosphate, triammonium phosphate, disodium phosphate, dipotassium phosphate, diammonium phosphate, sodium carbonate, potassium carbonate, ammonium carbonate, sodium hydrogen carbonate, potassium hydrogen carbonate, ammonium hydrogen carbonate, sodium borate, potassium borate, and ammonium borate. Also, organic alkaline agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine can be used. The alkaline agent can be used alone or in combination. Among the alkaline agent, sodium hydroxide and potassium hydroxide are preferred. Because it may be possible to control pH value in a wide range by adjusting the amount of the alkaline agent against the non-reducing sugar. In addition, tribasic sodium phosphate, tribasic potassium phosphate, sodium carbonate and potassium carbonate are also preferred because they show buffer action. These alkaline agents may be added so that the pH of the developer is in a range of 9.0 to 13.5. The amount of alkaline agent to be added may be defined depending on the desired pH, and kinds and the amount of non-reducing sugar. More preferable pH range is from 10.0 to 13.2.

The developer may further comprise an alkaline buffer consisting of weak acid other than saccharides and strong base. The weak acid used in the buffer has preferably 10.0 to 13.2 of pKa. Such weak acid may be selected from those described in IONISATION CONSTANTS OF ORGANIC ACIDS IN AQUEOUS SOLUTION (published by Pergamon Press), and for example, alcohols such as 2,2,3,3-tetrafluoropropanol-1 (pKa 12.74), trifluoroethanol (pKa 12.37), and trichloroethanol (pKa 12.24), aldehydes such as pyridine-2-aldehyde (pKa 12.68), and pyridine-4-aldehyde (pKa 12.05), compounds having phenolic hydroxy group such as salicylic acid (pKa 13.0), 3-hydroxy-2-naphthoic acid (pKa 12.84), catechol (pKa 12.6), gallic acid (pKa 12.4), sulfosalicylic acid (pKa 11.7), 3,4-dihydroxysulfonic acid (pKa 12.2), 3,4-dihydroxybenzoic acid (pKa 11.94), 1,2,4-trihydroxybenzene (pKa 11.82), hydroquinone (pKa 11.56), pyrogallol (pKa 11.34), o-cresol (pKa 10.33), resorcinol (pKa 11.27), p-cresol (pKa 10.27), m-cresol (pKa 10.09) and the like, oximes such as 2-butanone oxime (pKa 12.45), acetoxime pKa 12.42), 1,2-cycloheptanedione dioxime (pKa 12.3), 2-hydroxybenzaldehyde oxime (pKa 12.10), dimethylglyoxime pKa 11.9), ethanediamide dioxime pKa 11.37), and acetophenone oxime (pKa 11.35), compounds relating to nucleic acid such as adenosine (pKa 12.56), inosine (pKa 12.5), guanine (pKa 12.3), cytosine (pKa 12.2), hypoxanthine (pKa 12.1), and xanthine (pKa 11.9), as well as a weak acid such as diethylaminomethylphosphonic acid (pKa 12.32), 1-amino-3,3,3-trifluorobenzoic acid (pKa 12.29), isopropylidene diphosphonic acid (pKa 12.10), 1,1-ethylidene diphosphonic acid (pKa 11.54), 1,1-ethylidene diphosphonic acid 1-hydroxy (pKa 11.52), benzimidazole (pKa 12.86), thiobenzamide (pKa 12.8), picolinethioamide (pKa 12.55), and barbituric acid (pKa 12.5).

Preferable examples of weak acid are sulfosalicylic acid and salicylic acid. Preferable examples of base usable in combination with the foregoing weak acid may include sodium hydroxide, ammonium hydroxide, potassium hydroxide and lithium hydroxide. These alkaline agents can be used alone or in combination. The alkaline agent may be used with adjusting the pH of the developer to the desired range by altering the concentration and combination of the alkaline agents.

Surfactants

The developer of the present invention may optionally comprise a variety of surfactants or organic solvent for the purposes of improving developability, dispersibility of sludge after development and affinity to ink of image area on the printing plate. Surfactants usable herein are anionic, cationic, nonionic and amphoteric ones.

Examples of surfactants preferably used are nonionic surfactants such as polyoxyethylene alkyl ethers, polyoxyethylene alkylphenyl ethers, polyoxyethylene polystyrylphenyl ethers, polyoxyethylene polyoxypropylene alkyl ethers, glycerin fatty acid partial esters, sorbitan fatty acid partial esters, pentaerythritol fatty acid partial esters, propylene glycol fatty acid monoesters, sucrose fatty acid partial esters, polyoxyethylene sorbitan fatty acid partial esters, polyoxyethylene sorbitol fatty acid partial esters, polyethylene glycol fatty acid esters, polyglycerin fatty acid partial esters, polyoxyethylene-modified castor oils, polyoxyethylene glycerin fatty acid partial esters, fatty acid diethanolamides, N,N-bis-2-hydroxyalkylamines, polyoxyethylene alkylamines, triethanolamine fatty acid esters and trialkylamine oxides;

anionic surfactants such as fatty acid salts, abietic acid salts, hydroxyalkanesulfonic acid salts, alkanesulfonic acid salts, salts of dialkylsulfosuccinic acid esters, linear alkylbenzenesulfonic acid salts, branched alkylbenzenesulfonic acid salts, alkylnaphthalenesulfonic acid salts, alkylphenoxy polyoxyethylene propylsulfonic acid salts, polyoxyethylene alkylsulfophenyl ether salts, sodium salt of N-methyl-N-oleyltaurine, disodium salts of N-alkylsulfosuccinic acid monoamides, petroleum sulfonic acid salts, sulfated tallow oil, sulfuric acid ester salts of fatty acid alkyl esters, alkylsulfuric acid ester salts, polyoxyethylene alkyl ether sulfuric acid ester salts, fatty acid monoglyceride sulfuric acid ester salts, polyoxyethylene alkylphenyl ether sulfuric acid ester salts, polyoxyethylene styrylphenyl ether sulfuric acid ester salts, alkyl phosphoric acid ester salts, polyoxyethylene alkyl ether phosphoric acid ester salts, polyoxyethylene alkylphenyl ether phosphoric acid ester salts, partially saponified products of styrene/maleic anhydride copolymers, partially saponified products of olefin/maleic anhydride copolymers and naphthalenesulfonic acid salts/formalin condensates; cationic surfactants such as alkylamine salts, quaternary ammonium salts, polyoxyethylene alkylamine salts and polyethylene polyamine derivatives; amphoteric surfactants such as carboxy betaines, aminocarboxylic acids, sulfobetaines, aminosulfuric acid esters and imidazolines. The "polyoxyethylene" moiety of the foregoing surfactants can be replaced with polyoxyalkylene moieties such as polyoxymethylene, polyoxypropylene and polyoxybutylene and these surfactants can also be used in the present invention.

Examples of other surfactants preferably used are fluorine atom-containing ones having, in the molecules, perfluoroalkyl groups. Specific examples thereof include anionic type ones such as perfluoroalkylcarboxylic acid salts, perfluoroalkyl-sulfonic acid salts and perfluoroalkylphosphoric acid esters; amphoteric type ones such as perfluoroalkyl betaines; cationic type ones such as perfluoroalkyl trimethylammonium salts; and nonionic type ones such as perfluoroalkylamine oxides, perfluoroalkyl ethylene oxide adducts, oligomers carrying perfluoroalkyl groups and hydrophilic groups, oligomers carrying perfluoroalkyl groups and lipophilic groups, oligomers carrying perfluoroalkyl groups, hydrophilic groups and lipophilic groups and urethanes carrying perfluoroalkyl groups and lipophilic groups. The foregoing surfactants may be used alone or in combination and the amount thereof added to the back coat layer preferably ranges from 0.001 to 10% by weight and more preferably 0.01 to 5% by weight.

Stabilizing Agent for Development

A various kind of stabilizing agents may be used in the developer used in the present invention. Preferred examples thereof include polyethylene glycol adducts of sugar alcohols as described in J.P. KOKAI No. Hei 6-282079, tetraalkylammonium salt such as tetrabutylammonium hydroxide, phosphonium salt such as tetrabutylphosphonium bromide and iodonium salt such as diphenyliodonium chloride. Further, anionic surfactant or amphoteric surfactant as described in J.P. KOKAI No. Sho 50-51324, water-soluble cationic polymer as described in J.P. KOKAI No. Sho 55-95946, and water-soluble amphoteric polymeric electrolyte as described in J.P. KOKAI No. Sho 56-142528 can be used. Additionally, organic boric compounds having alkylene glycol adducts as described in J.P. KOKAI No. Sho 59-84241, water-soluble amphoteric surfactant that is a block polymer of polyoxyethylene-polyoxypropylene as described in J.P. KOKAI No. Sho 60-111246, alkylenediamine compounds in which polyoxyethylene polyoxypropylene are substituted as described in J.P. KOKAI No. Sho 60-129750, polyethylene glycol having 300 or more of weigh-average molecular weight. as described in J.P. KOKAI No. Sho 61-215554, fluorine-containing surfactant comprising cationic group as described in J.P. KOKAI No. Sho 63-175858, water-soluble ethylene oxide addition compound prepared by adding at least 4 mol of ethylene oxide to acid or alcohol and water-soluble polyalkylene compound as described in J.P. KOKAI No. Hei 2-39157.

Organic Solvent

The developer does not substantially comprise organic solvent. But, if necessary, organic solvent can be added. As such organic solvent, those having approximately 10% by weight or less of solubility to water are suitably used, and preferably the organic solvent is sleeted from those having 5% by weight or less of solubility. Examples of such organic solvent include 1-phenylethanol, 2-phenylethanol, 3-phenyl-1-propanol, 4-phenyl-1-butanol, 4-phenyl-2-butanol, 2-phenyl-1-butanol, 2-phenoxyethanol, 2-benzyloxyethanol, o-methoxybenzylalcohol, m-methoxybenzylalcohol, p-methoxybenzylalcohol, benzylalcohol, cyclohexanol, 2-methylcyclohexanol, 3-methylcyclohexanol and 4-methylcyclohexanol, N-phenylethanolamine and N-phenyldiethanolamine. In the present specification, the phrase "does not substantially comprise organic solvent" means that the amount of organic solvent does not exceed 5% by weight based on the total weight of the developer. The amount thereof is closely related to the amount of surfactant. It is preferable to increase the amount of surfactant to be used depending upon the increase of the amount of the organic solvent. Because, if the amount of organic solvent is excess as against the amount of surfactant, the organic solvent may not be dissolved completely. As a result, it may be difficult to obtain a good developability of the developer.

Reducing Agent

Further, the developer may contain reducing agents, which would prevent contamination of the printing plate with being especially effective in the development of the negative-working photosensitive presensitized plate comprising photosensitive diazonium salt compound. Preferred examples of organic reducing agents include phenol compounds such as thiosalicylic acid, hydroquinone, metol, methoxyquinone, resorcin, and 2-methylresorcin, amine compounds such as phenylenediamine and phenylhydrazine. More preferable inorganic reducing agents are sodium, potassium and ammonium salts of inorganic acids such as sulfurous acid, hydrosulfurous acid, phosphorous acid, hydrogenphosphorous acid, dihydrogenphosphorous acid, thiosulfuric acid and dithionous acid. Among these, sulfites show particularly excellent effect of preventing contamination. These reducing agents are preferably used in an amount ranging from 0.05 to 5% by weight on the basis of the weight of the developer practically employed.

Organic Carboxylic Acid

The developer may also comprise organic carboxylic acids. Preferred are aliphatic and aromatic carboxylic acids having 6 to 20 carbon atoms. Specific examples of the aliphatic carboxylic acids are caproic acid, enanthylic acid, caprylic acid, lauric acid, myristic acid, palmitic acid and stearic acid with the alkanoic acids having 8 to 12 carbon atoms being particularly preferred. These aliphatic acids may be unsaturated ones having, in the carbon chain, double bonds or those having branched carbon chains. Examples of aromatic carboxylic acid include benzene ring, naphthalene ring, or anthracene ring having carboxyl group thereon, e.g., o-chlorobenzoic acid, p-chlorobenzoic acid, o-hydroxybenzoic acid, p-hydroxybenzoic acid, o-aminobenzoic acid, p-aminobenzoic acid, 2,4-dihydroxybenzoic acid, 2,5-dihydroxybenzoic acid, 2,6-dihydroxybenzoic acid, 2,3-dihydroxybenzoic acid, 3,5-dihydroxybenzoic acid, gallic acid, 1-hydroxy-2-naphthoic acid, 3-hydroxy-2-naphthoic acid, 2-hydroxy-1-naphthoic acid, 1-naphthoic acid, 2-naphthoic acid and the like. Especially hydroxynaphthoic acid is effective. The foregoing aliphatic and aromatic carboxylic acids are preferably used in the form of sodium, potassium or ammonium salt for improving the solubility thereof in water. The amount of the organic carboxylic acids used in the developer is not restricted to a particular range. However, if they are used in an amount of less than 0.1% by weight, the desired effect thereof is not anticipated, while if they are used in an amount of more than 10% by weight, any further effect thereof is not anticipated and if other additives are simultaneously used, they interrupt the dissolution thereof Therefore, the amount of the carboxylic acids preferably ranges from 0.1 to 10% by weight and more preferably 0.5 to 4% by weight on the basis of the total weight of the developer practically used.

Other Additives

The developer used in the invention may optionally comprise currently known additives such as preservatives, coloring agents, thickening agents, antifoaming agents, and water softeners. Examples of water softeners include polyphosphoric acids and sodium, potassium and ammonium salts thereof; polyaminocarboxylic acids and salts thereof such as ethylenediaminetetraacetic acid, diethylenetriaminepentaacetic acid, triethylenetetraminehexaacetic acid, hydroxyethylethylenediaminetriacetic acid, nitrilotriacetic acid, 1,2-diaminocyclohexanetetraacetic acid and 1,3-diamino-2-propanoltetraacetic acid, and ammonium, potassium and sodium salts thereof; aminotri(methylenephosphonic acid), ethylenediaminetetra(methylenephosphonic acid), diethylenetriaminepenta(methylenephosphonic acid), triethylenetetraminehexa(methylenephosphonic acid), hydroxyethylethylenediaminetri(methylenephosphonic acid) and 1-hydroxyethane-1,1-diphosphonic acid, and ammonium, potassium and sodium salts thereof.

The optimum amount of a water softener varies depending on the chelating ability of the softener, the hardness and the amount of hard water utilized, but the amount thereof in general ranges from 0.01 to 5% by weight and preferably 0.01 to 0.5% by weight on the basis of the total weight of the developer practically used. If the amount of the softener is less than the lower limit, the desired effect cannot be anticipated, while if it exceeds the upper limit, images are adversely affected and cause color blinding or the like. The balance of the developer and replenisher used in the invention is water. It is preferred to prepare the developer and replenisher in the form of stock solutions having contents of the components higher than those practically used and diluted prior to use from the viewpoint of transportation. In this case, the contents are preferably selected such that each component does not cause separation and precipitation.

Development and Post-treatment

The presensitized plate thus developed is in general subjected to post-treatments with washing-water, a rinsing solution containing, for instance, a surfactant and/or a desensitizing gum solution containing, for instance, gum arabic and starch derivatives. The presensitized plate can be subjected to any combination of these post-treatments. Recently, there has been widely used an automatic developing machine for presensitized plates in the fields of plate-making and printing industries for rationalizing and standardizing the plate-making operations. This automatic developing machine in general comprises a developing zone and a post-treating zone and the developing zone comprises a device for transporting PS plates, tanks for accommodating processing solutions and a spray device. In this machine, presensitized plate is developed by spraying each processing solution pumped up on the surface of the plate through a spray nozzle while continuously conveying the imagewise exposed plate. Recently, it has also been known a method in which presensitized plate is conveyed and immersed in a processing solution contained in a tank by the action of dipped guide rolls to thus develop the plate, or a method in which presensitized plate is washed with water by supplying a small amount of water onto the surface of the plate and thus obtained waste water is recycled as a dilluent for stock solution of developer. In such automatic development, the processing can be performed while supplementing a replenisher to each processing tank in proportion to the quantity of presensitized plates processed and the running time of the machine.

EXAMPLES

Hereinafter, the present invention will be explained by Examples. But the present invention is not limited to these Examples.

Examples Using Nitrite Group-containing Compound

Examples 1 to 14 and Comparative Examples 1 to 4

Preparation of Substrate (a) A molten aluminum (Al) comprised of a composition described in Table 1 was prepared and it was treated and filtered. Then an ingot having a thickness of 500 mm and a width of 1200 mm was prepared therefrom by DC casting method. The surface (a thickness of 10 mm on the average) of the ingot was pared by a facing machine. Then it was soaked at 550° C. for about 5 hours. After the temperature of the ingot became 400° C., a flat-rolled plate having a thickness of 2.7 mm was prepared by hot-rolling. Further, it was heat-treated at 500° C. by use of a continuous annealing machine and then, the plate was treated by cold-rolling to make the thickness of the plate to 0.24 mm. The aluminum plate was treated so that the width thereof became 1030 mm and then, it was further continuously treated as follows.

TABLE 1

| Composition | Si | Fe | Cu | Mn | Mg | Zn | Ti |
|---|---|---|---|---|---|---|---|
| | 0.06 | 0.30 | 0.017 | 0.001 | 0.001 | 0.001 | 0.03 |

(b) The aluminum plate was etched with a solution comprising 26% by weight of sodium hydroxide and 6.5% by weight of aluminum ion, at 70° C. using a spray to dissolve the aluminum plate in an amount of 7 $g/m^2$. Then the plate was washed with a spray of water.

(c) The plate was then sprayed with an aqueous solution comprising 1% by weight of nitric acid and 0.5% by weight of aluminum ion at 30° C. to desmut the plate followed by washed with a spray of water. The aqueous solution comprising nitric acid used for desmutting was a waste solution from a step wherein a plate was electrochemically roughened with alternating current in aqueous solution of nitric acid.

(d) The plate was then continuously roughened using electrochemical method with alternating current of 60 Hz. The electrolytic solution used was a solution containing 1% by weight of nitric acid with 0.5% by weight of aluminum ion and 0.007% by weight of ammonium ion at 50° C. The plate was electrochemically grained using an alternating current having a waveform with TP=2 msec (a time till the current value achieves the peak from zero), duty=1:1, and a square wave (trapeziform) and using a carbon counter electrode. Ferrite was used as an auxiliary anode. Two electrolytic cells were used.

The density of the current was 30 $A/dm^2$ at peak value and the amount of the current was totally 230 $C/dm^2$ at the time of anodization. Five percent of the current from the power supply was split into the auxiliary anode. Then it was washed with a spray of water.

(e) The aluminum plate was then etched by spraying a solution comprising 26% by weight of sodium hydroxide and 6.5% by weight of aluminum ion at 70° C. to dissolve 0.2 $g/m^2$ of the aluminum plate to remove smut formed during the electrochemical graining process using alternate current, which the smut contains aluminum hydroxide as a main component and to dissolve the edge portion of the formed pit to make it smooth. Then the plate was washed with a spray of water.

(f) The plate was sprayed with an 25% by weight of aqueous sulfuric acid solution comprising 0.5% by weight of aluminum ion at 60° C. to desmut the plate. Then the plate was washed by a spray of water.

(g) The plate was anodized using a device for anodization with 170 g/l of sulfuric acid containing 0.5% by weight of aluminum ion at 40° C. and 30 $A/dm^2$, until the amount of anodization became 2.5 $g/m^2$. Thus prepared substrate is called as "substrate A".

Substrate A was treated with a solution containing nitrite or the like as described in Table 2 and washed with water to prepare each substrate. In the table, the treatment with steam was conducted at 100° C. for 10 seconds. Other treatments were conducted at 80° C. for 1 minute (unless specific conditions are mentioned).

On the surface of thus treated substrate, the composition comprising compound A described below was coated in an amount of 15 $mg/m^2$ and it was then dried for 10 seconds at 80° C. Then a coating solution of photosensitive composition A was coated thereon to form a photosensitive layer. The amount of the photosensitive layer coated after being dried was 1.3 $g/m^2$. Further, a mat layer was formed thereon in order to reduce the time required for evacuation during contact exposure as disclosed in J.P. KOKOKU No. Sho 61-28986 to prepare a presensitized plate for the preparation of lithographic printing plate.

[Composition comprising compound A]

Methanol: 100 g
Purified water: 1 g
Compound A (molecular weight 28,000): 0.16 g
Compound A

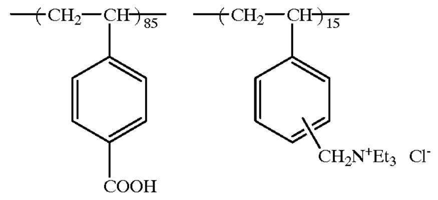

Coating Solution of Photosensitive Composition A

Esterified product of 1,2-diazonaphthoquinone-5-sulfonyl chloride and pyrogallol/acetone resin (disclosed in Example 1 of U.S. Pat. No. 3,635,709)

| | |
|---|---|
| Binder | 0.8 g |
| Novolak resin I (see the chemical structure below) | 1.5 g |
| Novolak resin II (see the chemical structure below) | 0.2 g |
| Resin III other than novolak (see the chemical structure below) | 0.4 g |
| p-Normaloctylphenol-formaldehyde resin (that is disclosed in U.S. Pat. No. 4,123,279) | 0.02 g |
| Naphthoquinone-1,2-diazide-4-sulfonyl chloride | 0.01 g |
| Tetrahydrophthalic anhydride | 0.02 g |
| Benzoic acid | 0.02 g |
| Pyrogallol | 0.05 g |
| 4-[p-N,N-bis(ethoxycarbonylmethyl)aminophenyl]-2,6-bis(trichloromethyl)-S-triazine (hereinafter, called as "triazine A") | 0.07 g |
| Victoria Pure Blue BOH (a dye prepared by changing a counter anion of the product available from Hodogaya Chemical Co. Ltd. to 1-naphthalenesulfonic acid) | 0.045 g |
| F176PF (fluorine atom-containing surfactant available from Dainippon Ink and Chemicals, Inc.) | 0.01 g |
| Methyl ethyl ketone | 15 g |
| 1-Methoxy-2-propanol | 10 g |
| Novolak (I) | |

-continued

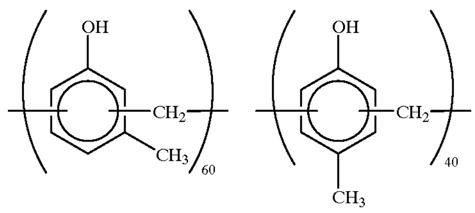

Mw8000

Novolak (II)

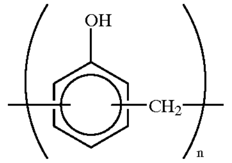

Mw15000

Resin (III) other than novolak

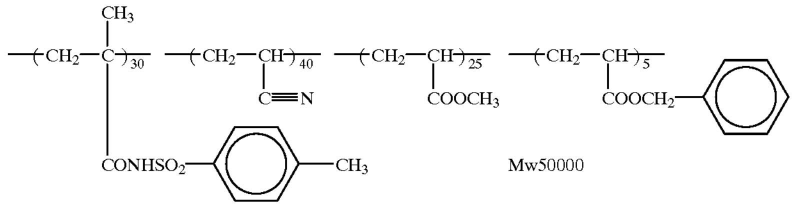

Mw50000

Thus prepared presensitized plate for the preparation of lithographic printing plate was imagewise exposed with a 3 kW metal halide lamp at a distance from 1 m for 1 minute. The exposed plate was developed with developer A or B described below using PS processor 900VR (manufactured by Fuji Photo Film Co. Ltd.) at 30° C. for 12 seconds (Examples 1 to 14 and Comparative Examples 1 to 4).

| | |
|---|---|
| Developer A (pH = 13): | |
| D-Sorbitol | 5.1 parts by weight |
| Sodium hydroxide | 1.1 parts by weight |
| Triethanolamine.ethylenoxide adduct (30 moles) | 0.03 parts by weight |
| Water | 93.8 parts by weight |
| Developer B: | |
| Aqueous solution of sodium silicate (molar ratio of $[SiO_2]/[Na_2O]$ = 1.2, comprising 1.4% by weight of $SiO_2$) | 100 parts by weight |
| Ethylenediamine.ethyelenoxide adduct (30 moles) | 0.03 parts by weight |

Thus developed lithographic printing plate was tested for its printing durability, contamination property, remaining of color and remaining of film, and mud·sludge in the developer. The results were shown in Table 2. These properties were evaluated as described below.

Printing durability: The developed plate was printed using the a printer (Printer Sprint, Komori Printer Co. Ltd.) until normal copy can not be obtained. The number of the normal copies obtained was determined and it is considered to be an indicator for printing durability of the plate. The higher number of the copies indicates a better durability.

Contamination Property: After 1000 copies were printed with the developed plate using SOR-M printer (Heiderberg), the machine was stopped and the plate was allowed to stand for 30 minutes. Then, 100 copies were obtained with the plate again. The number of copies which were contaminated at the portion corresponding to the non-image area of the plate was determined. The smaller number of the copies having contamination indicates a better contamination property.

Mud and Sludge: After the plate was developed with a developer using 1L of the developer per 10 $m^2$ of the plate, mud in the developer was visibly determined to decide the degree of solubility of the oxidized layer to the alkaline developer.

○ . . . no mud and/or sludge observed

Δ . . . mud and/or sludge observed but not so much as in the case marked with "x"

x . . . a large amount of mud and/or sludge observed

Remaining of film: The difference (ΔD) between reflective optical density of non-image area of the developed printing plate at 280 nm and that of the surface of the substrate before coating a photosensitive layer was determined. A smaller ΔD indicates a better property in remaining of film.

Remaining of color: The difference (ΔD) between reflective optical density of non-image area of the developed printing plate at 600 nm and that of the surface of the substrate before coating a photosensitive layer was determined. A smaller ΔD indicates a better property in remaining of color.

As shown in the table below, the printing plates prepared by developing a presensitized plate for the lithographic printing plate that has been treated with nitrite salt with a developer comprising no silicate (Examples 1 to 14) show good properties of contamination, durability, remaining of color, remaining of film and do not cause any mud and sludge in the developer. However, the printing plates of Comparative Examples 1 to 4 do not show sufficient properties of contamination, durability, remaining of color, remaining of film, and mud·sludge.

TABLE 2

| Ex./ Com. Ex. | 1st bath | 2nd bath | Dev. | Con. | mud. sludge | Printing durability | RC (ΔD) | RF (ΔD) |
|---|---|---|---|---|---|---|---|---|
| Ex. | | | | | | | | |
| 1 | Sodium nitrite/1%1 | None | A | 20 | ○ | 50,000 | 0.01 | 0.03 |
| 2 | ammonium nitrite/0.5% | None | A | 21 | ○ | 50,000 | 0.02 | 0.06 |
| 3 | potassium benzoate/0.3% | sodium nitrite/0.25% | A | 22 | ○ | 55,000 | 0.01 | 0.03 |
| 4 | sodium silicate/0.5% | sodium nitrite/0.5% | A | 17 | ○ | 50,000 | 0.03 | 0.10 |
| 5 | purified water | sodium nitrite/1% | A | 19 | ○ | 50,000 | 0.02 | 0.04 |
| 6 | sodium silicate/0.01% + sodium nitrite/0.5% | None | A | 17 | ○ | 45,000 | 0.03 | 0.07 |
| 7 | sodium nitrite/0.5% | Steam*1 | A | 19 | ○ | 50,000 | 0.01 | 0.02 |
| 8 | sodium nitrite/1% + monobasic ammonium phosphate/0.3% | None | A | 20 | ○ | 50,000 | 0.01 | 0.03 |
| 9 | sodium nitrite/1% + potassium benzoate/0.3% | None | A | 19 | ○ | 50,000 | 0.01 | 0.03 |
| 10 | sodium nitrite/1% + sodium lauryl sulfate/0.3% | None | A | 20 | ○ | 50,000 | 0.01 | 0.02 |
| 11 | sodium nitrite/1% + γ-aminopropyl-triethoxysilane/0.1% | None | A | 22 | ○ | 55,000 | 0.01 | 0.03 |
| 12 | sodium nitrite/1% | potassium benzoate/0.3% | A | 21 | ○ | 50,000 | 0.02 | 0.04 |
| 13 | sodium nitrite/1% | sodium lauryl sulfate/0.3% | A | 23 | ○ | 55,000 | 0.02 | 0.07 |
| 14 | sodium nitrite/1% | monobasic ammonium phosphate/0.3% | A | 21 | ○ | 50,000 | 0.01 | 0.03 |
| Com. Ex. | | | | | | | | |
| 1 | sodium sulfate/1% | None | A | 34 | X | 40,000 | 0.06 | 0.32 |
| 2 | Steam*1 | None | A | 26 | X | 50,000 | 0.02 | 0.05 |
| 3 | sodium silicate/0.5% | None | A | 18 | ○ | 10,000 | 0.15 | 0.23 |
| 4 | sodium nitrite/1% | None | B | 22 | Δ | 40,000 | 0.06 | 0.25 |

*1 100° C., 10 seconds, Dev.: Developer, Con.: Contamination, RC: Remaining of color, RF: Remaining of film,

Examples 15 and 16, and Comparative Examples 5 and 6

After substrate A was treated according to Table 3 below, compound A was coated thereon as described in Examples 1 to 14 in an amount of 15 mg/m$^2$ followed by being dried at 80° C. for 10 seconds. Coating solution of photosensitive composition B (below) was prepared and it was coated on the undercoated substrate in an amount of 1.0 g/m$^2$ to provide a presensitized plate for the preparation of lithographic printing plate. In table 3, the treatment with a solution comprising nitrite salt was conducted at 80° C. for 1 minute unless specifically mentioned.

| (Coating solution of photosensitive composition B) | |
|---|---|
| Capric acid | 0.03 g |
| Copolymer 1 (see below) | 0.75 g |
| m,p-Cresol novolak resin (ratio of m/p = 6/4, weight-average molecular weight: 3,500, containing 0.5% by weight of unreacted cresol) | 0.25 g |
| p-Toluenesulfonic acid | 0.003 g |
| Tetrahydrophthalic anhydride | 0.03 g |
| Cyanine dye A (see the chemical structure below) | 0.017 g |
| Dye derived from Victoria Pure Blue BOH [Hodogaya Chemical Co., Ltd.] by replacing counter anion thereof with 1-naphthalenesulfonic acid | 0.015 g |
| Megafac F-177 (fluorine atom-containing surfactant, available from Dainippon Ink and Chemicals, Inc) | 0.05 g |
| γ-Butyrolactone | 10 g |
| Methyl ethyl ketone | 10 g |
| 1-Methoxy-2-propanol | 1 g |

Cyanine dye A

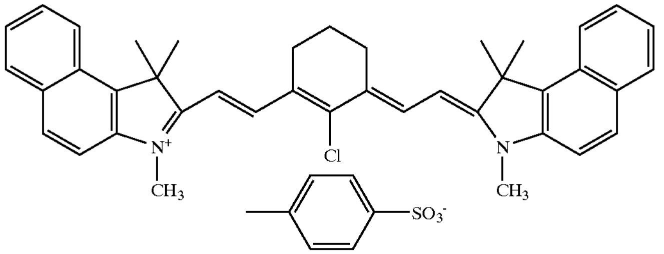

Preparation of Copolymer 1

In a 500 ml volume of three-neck round bottom flask equipped with a condenser, an agitator and a dropping funnel, methacrylic acid (31.0 g, 0.36 mol), ethyl chloroformate (39.1 g, 0.36 mol) and acetonitrile 200 ml were added and the mixture was stirred in an ice bath. To the mixture, triethylamine (36.4 g, 0.36 mol) was added dropwise for about one hour using the dropping funnel. After completion of the dropping, the ice bath was removed and the mixture was stirred for 30 minutes at room temperature.

To the reaction mixture, p-aminobenzenesulfonamide (51.7 g, 0.30 mol) was added and the mixture was stirred for 1 hour in a oil bath at 79° C. After the completion of the reaction, the mixture was poured into 1 L of water with stirring and the stirring was continued for 30 minutes. The reaction mixture was filtered to obtain precipitate in the mixture. The precipitate was poured into a 500 mL of water and the resulted slurry was filtered. Thus obtained solid was dried to give N-(p-aminosulfonylphenyl)methacrylamide as white solid (yield 46.9 g).

In a 20 ml volume of three-neck round bottom flask equipped with an agitator, a condenser and a dropping funnel, N-(p-aminosulfonylphenyl)methacrylamide (4.61 g, 0.0192 mol), ethyl methacrylate (2.94 g, 0.0258 mol), acrylonitrile (0.80 g, 0.015 mol) and N,N-dimethylacetamide (20 g) were added. The mixture was heated at 65° C. with stirring in a water bath. "V-65" (Wako Pure Chemicals Co. Ltd., 0.15 g) was added to the mixture and the mixture was stirred for 2 hours at 65° C. under nitrogen flow. To the reaction mixture, further a mixture of N-(p-aminosulfonylphenyl)methacrylamide 4.61 g, ethyl methacrylate 2.94 g, acrylonitrile 0.80 g, N,N-dimethylacetamide 20 g and "V-65" 0.15 g was dropwise added through the dropping funnel for 2 hours. After the addition was completed, the mixture was further stirred for 2 hours at 65° C. Then 40 g of methanol was added to the mixture and the mixture was cooled. The resulted mixture was poured into 2 L of water with stirring. After being stirred for 30 minutes, precipitate was separated by filtration and the precipitate was dried to obtain 15 g of white solid. The weight-average molecular weight (polystyrene standard) of the copolymer 1, determined by gel permeation chromatography, was 53,000.

Thus obtained presensitized plate was image-wise exposed with a trendsetter (Creo company) (a plate setter with a semiconductive laser of 830 nm having 40 W of wavelength) at 150 rpm (drum winding number). Then the plate was developed with developer (A) comprising no silicate (Examples 15 and 16, and Comparative Examples 5 and 6).

Contamination, printing durability, properties of remaining color and mud and sludge in the developer were evaluated as in Example 1. In addition, sensitivity of the plate was evaluated as described below.

Sensitivity: The plate was exposed to light with the variety of amount of light and each plate was developed. The density of the non-image area of the plate after the development was determined by Macbeth densimeter. The amount of light by which the density of the non-image area becomes constant was determined as the sensitivity of the plate.

The lithographic printing plate prepared from the presensitized plate which was treated with an aqueous solution comprising nitrite group-containing compound showed good properties in contamination, printing durability and remaining of color as well as high sensitivity. Also, there was no mud and sludge in the developer (Examples 15 and 16). However, the substrate treated with sodium silicate (Comparative Example 5) showed deteriorated properties especially in printing durability, remaining of color and sensitivity. Also, when the thermosensitive printing plate treated with sodium nitrite was developed with a developer comprising silicate (Comparative Example 6), every property relating to contamination, printing durability, property of remaining of color, sensitivity and mud and sludge in the developer was deteriorated.

TABLE 3

| Example/ Com. Ex. | | 1st bath | 2nd bath | Dev. | Con. | MS | Dur. | RC (ΔD) | S (mJ/cm²) |
|---|---|---|---|---|---|---|---|---|---|
| Ex. | 15 | Sodium nitrite/1% | None | A | 22 | O | 50,000 | 0.02 | 50 |
| | 16 | Sodium silicate/0.5%*2 | Sodium nitrite/0.5% | A | 17 | O | 45,000 | 0.03 | 45 |
| Com. Ex. | 5 | Sodium silicate/0.5%*2 | None | A | 18 | O | 10,000 | 0.15 | 75 |
| | 6 | Sodium nitrite/1% | None | B | 22 | Δ | 40,000 | 0.06 | 65 |

*2 30° C., 1 minute
Dev.: Developer, Con.: Contamination, MS: mud and sludge in the developer, Dur: Durability, RC: Remaining of color, S: Sensitivity

Examples Using Fluorine Atom-containing Compound

Examples 17 to 23 and Comparative Examples 7 to 10

Preparation of Substrate (a) A molten aluminum (Al) comprised of a composition described in Table 4 was prepared and it was treated and filtered. Then an ingot having a thickness of 500 mm and a width of 1200 mm was prepared therefrom by DC casting method. The surface (a thickness of 10 mm on the average) of the ingot was pared by a facing machine. Then it was soaked at 550° C. for about 5 hours. After the temperature of the ingot became 400° C., a flat-rolled plate having a thickness of 2.7 mm was prepared by hot-rolling. Further, it was heat-treated at 500° C. by use of a continuous annealing machine and then, the plate was treated by cold-rolling to make the thickness of the plate to 0.24 mm. The aluminum plate was treated so that the width thereof became 1030 mm and then, it was further continuously treated as follows.

TABLE 4

| Composition | Si | Fe | Cu | Mn | Mg | Zn | Ti |
|---|---|---|---|---|---|---|---|
| | 0.06 | 0.30 | 0.017 | 0.001 | 0.001 | 0.001 | 0.03 |

(b) The aluminum plate was surface-grained with a nylon brush and a suspension of 400 mesh pumice stone and fully washed with water. Then it was etched with a solution comprising 26% by weight of sodium hydroxide and 6.5% by weight of aluminum ion, at 70° C. using a spray to dissolve the aluminum plate in an amount of 7 g/m$^2$. Then the plate was washed with a spray of water.

(c) The plate was then sprayed with an aqueous solution comprising 1% by weight of nitric acid and 0.5% by weight of aluminum ion at 30° C. to desmut the plate followed by washed with a spray of water. The aqueous solution comprising nitric acid used for desmutting was a waste solution from a step wherein a plate was electrochemically roughened with alternating current in aqueous solution of nitric acid.

(d) The plate was then continuously roughened using electrochemical method with alternating current of 60 Hz. The electrolytic solution used was a solution containing 1% by weight of nitric acid with 0.5% by weight of aluminum ion and 0.007% by weight of ammonium ion at 50° C. The plate was electrochemically grained using an alternating current having a waveform with TP=2 msec (a time till the current value achieves the peak from zero), duty=1:1, and a square wave (trapeziform) and using a carbon counter electrode. Ferrite was used as an auxiliary anode. Two electrolytic cells were used.

The density of the current was 30 A/dm$^2$ at peak value and the amount of the current was totally 230 C/dm$^2$ at the time of anodization. Five percent of the current from the power supply was split into the auxiliary anode. Then it was washed with a spray of water.

(e) The aluminum plate was then etched by spraying a solution comprising 26% by weight of sodium hydroxide and 6.5% by weight of aluminum ion at 70° C. to dissolve 0.2 g/m$^2$ of the aluminum plate to remove smut formed during the electrochemical graining process using alternate current, which the smut contains aluminum hydroxide as a main component and to dissolve the edge portion of the formed pit to make it smooth. Then the plate was washed with a spray of water.

(f) The plate was sprayed with an 25% by weight of aqueous sulfuric acid solution comprising 0.5% by weight of aluminum ion at 60° C. to desmut the plate. Then the plate was washed by a spray of water.

(g) The plate was anodized using a device for anodization with 170 g/l of sulfuric acid containing 0.5% by weight of aluminum ion at 40° C. and 30 A/dm$^2$, until the amount of anodization became 2.5 g/m$^2$. Thus prepared substrate is called as "substrate B".

Substrate B was treated with a solution containing fluorine atom-containing compound or the like as described in Table 5 and washed with water to prepare each substrate.

The degree of fluorination of the surface of each substrate was determined using the following device under the conditions mentioned below.

Device: PHI-5400MC (ULVAC•PHI Inc)

Source of X ray: MgK$_\alpha$ (400 W)

Pass energy: 71.55 eV

Area analyzed: 1.1 mm $\phi$

Angle for taking out of the photoelectron: 45 degree

On the surface of thus treated substrate, the composition comprising compound A as described in Examples 1 to 14 was coated and it was then dried for 10 seconds at 80° C. The amount of the layer after dried was 6.5 mg/m$^2$. Then a coating solution of photosensitive composition A as described in Examples 1 to 14 was coated thereon to form a photosensitive layer. The amount of the photosensitive layer coated after dried was 1.3 g/m$^2$. Further, a mat layer was formed thereon in order to reduce the time required for evacuation during contact exposure as disclosed in J.P. KOKOKU No. Sho 61-28986 to prepare a presensitized plate for the preparation of lithographic printing plate.

Thus prepared presensitized plate for the preparation of lithographic printing plate was imagewise exposed with a 3 kW metal halide lamp at a distance from 1 m for 1 minute. The exposed plate was developed with developer A or B as described in Examples 1 to 14 using PS processor 900VR (manufactured by Fuji Photo Film Co. Ltd.) at 30° C. for 12 seconds (Examples 17 to 23 and Comparative Examples 7 to 10).

Thus developed lithographic printing plate was tested for its printing durability, contamination property, remaining of color and remaining of film, and mud∩sludge in the developer. The results were shown in Table 5. These properties were evaluated as described in Examples 1 to 14.

As shown in the table below, when the printing plates having a degree of fluorination is in the range of 0.3 to 0.9 was developed with a developer comprising no silicate (Examples 17 to 23) show good properties of contamination, durability, remaining of color, remaining of film and do not cause any mud and sludge in the developer. However, the printing plates of Comparative Examples 7 to 10 do not show sufficient properties of contamination, durability, remaining of color, remaining of film, and mud sludge.

TABLE 5

| Ex./ Com. Ex. | 1st bath (condition) | 2nd bath (condition) | Degree of F[1)] | Dev. | Con. | MS | Dur. | RC (ΔD) | RF (ΔD) |
|---|---|---|---|---|---|---|---|---|---|
| Ex. | | | | | | | | | |
| 17 | No. 3 sodium silicate 1% + sodium fluoride 2% (60° C., 1 min.) | None | 0.82 | A | 22 | ○ | 50,000 | 0.05 | 0.05 |
| 18 | sodium fluoride 2% (50° C., 15 sec.) | None | 0.64 | A | 24 | ○ | 60,000 | 0.02 | 0.06 |
| 19 | potassium fluoride 5% + sodium dihydrogenphosphate 15% + potassium silicate 0.1% (50° C., 20 sec.) | None | 0.72 | A | 21 | ○ | 55,000 | 0.04 | 0.04 |
| 20 | sodium fluoride 0.1% + sodium dihydrogenphosphate 10% (80° C., 30 sec.) | None | 0.34 | A | 24 | ○ | 60,000 | 0.03 | 0.10 |

TABLE 5-continued

| Ex./ Com. Ex. | 1st bath (condition) | 2nd bath (condition) | Degree of F1) | Dev. | Con. | MS | Dur. | RC (ΔD) | RF (ΔD) |
|---|---|---|---|---|---|---|---|---|---|
| 21 | No. 3 sodium silicate 1% (50° C., 30 sec.) | potassium fluorozirconate 0.1% (60° C., 10 sec.) | 0.41 | A | 24 | ○ | 55,000 | 0.02 | 0.04 |
| 22 | potassium fluorotitanate 0.1% (60° C., 10 sec.) | No. 3 sodium silicate 1%, (70° C., 30 sec.) | 0.33 | A | 21 | ○ | 55,000 | 0.03 | 0.07 |
| 23 | polyvinylphosphonic acid 2% + sodium fluoride 1% (70° C., 1 min.) | None | 0.55 | A | 25 | ○ | 60,000 | 0.01 | 0.02 |
| Com. Ex. | | | | | | | | | |
| 7 | None | None | 0.12 | A | 35 | X | 60,000 | 0.06 | 0.32 |
| 8 | sodium fluoride 0.1% (20° C., 5 sec.) | None | 0.27 | A | 23 | X | 60,000 | 0.03 | 0.06 |
| 9 | sodium fluoride 10% (100° C., 1 min.) | None | 0.92 | A | 24 | ○ | 20,000 | 0.02 | 0.04 |
| 10 | sodium fluoride 2% (50° C., 15 sec.) | None | 0.64 | B | 26 | Δ | 60,000 | 0.10 | 0.25 |

1)Degree of F: Degree of fluorination (A/(A + B)), Dev: Developer, Con.: Contamination, MS: Mud and sludge, Dur: Durability, RC: Remaining of color, RF: Remaining of film

Examples Using Phosphorous Atom-containing Compound

Examples 24 to 28 and Comparative Examples 11 to 13

Preparation of Substrate (a) A molten aluminum (Al) comprised of a composition described in Table 6 was prepared and it was treated and filtered. Then an ingot having a thickness of 500 mm and a width of 1200 mm was prepared therefrom by DC casting method. The surface (a thickness of 10 mm on the average) of the ingot was pared by a facing machine. Then it was soaked at 550° C. for about 5 hours. After the temperature of the ingot became 400° C., a flat-rolled plate having a thickness of 2.7 mm was prepared by hot-rolling. Further, it was heat-treated at 500° C. by use of a continuous annealing machine and then, the plate was treated by cold-rolling to make the thickness of the plate to 0.24 mm. The aluminum plate was treated so that the width thereof became 1030 mm and then, it was further continuously treated as follows.

TABLE 6

| Composition | Si | Fe | Cu | Mn | Mg | Zn | Ti |
|---|---|---|---|---|---|---|---|
| | 0.06 | 0.30 | 0.017 | 0.001 | 0.001 | 0.001 | 0.03 |

(b) The aluminum plate was surface-grained with a nylon brush and a suspension of 400 mesh pumice stone and fully washed with water. Then it was etched with a solution comprising 26% by weight of sodium hydroxide and 6.5% by weight of aluminum ion, at 70° C. using a spray to dissolve the aluminum plate in an amount of 7 g/m$^2$. Then the plate was washed with a spray of water.

(c) The plate was then sprayed with an aqueous solution comprising 1% by weight of nitric acid and 0.5% by weight of aluminum ion at 30° C. to desmut the plate followed by washed with a spray of water. The aqueous solution comprising nitric acid used for desmutting was a waste solution from a step wherein a plate was electrochemically roughened with alternating current in aqueous solution of nitric acid.

°C. The plate was then continuously roughened using electrochemical method with alternating current of 60 Hz. The electrolytic solution used was a solution containing 1% by weight of nitric acid with 0.5% by weight of aluminum ion and 0.007% by weight of ammonium ion at 50°. The plate was electrochemically grained using an alternating current having a waveform with TP=2 msec (a time till the current value achieves the peak from zero), duty=1:1, and a square wave (trapeziform) and using a carbon counter electrode. Ferrite was used as an auxiliary anode. Two electrolytic cells were used.

The density of the current was 30 A/dm$^2$ at peak value and the amount of the current was totally 230 C/dm$^2$ at the time of anodization. Five percent of the current from the power supply was split into the auxiliary anode. Then it an was washed with a spray of water.

(e) The aluminum plate was then etched by spraying a solution comprising 26% by weight of sodium hydroxide and 6.5% by weight of aluminum ion at 70° C. to dissolve 0.2 g/m$^2$ of the aluminum plate to remove smut formed during the electrochemical graining process using alternate current, which the smut contains aluminum hydroxide as a main component and to dissolve the edge portion of the formed pit to make it smooth. Then the plate was washed with a spray of water.

(f) The plate was sprayed with an 25% by weight of aqueous sulfuric acid solution comprising 0.5% by weight of aluminum ion at 60° C. to desmut the plate. Then the plate was washed by a spray of water. Thus obtained plate is called as "substrate C".

(g) The substrate C was anodized using a device for anodization with 170 g/l of sulfuric acid containing 0.5% by weight of aluminum ion at 40° C. and 30 A/dm$^2$, until the amount of anodization became 2.5 g/m$^2$. Thus prepared substrate is called as "substrate D".

(h) Substrate D was treated with a solution containing phosphorous atom-containing compound or the like as described in Table 7 and washed with water to prepare each substrate.

The degree of phosphorization of the surface of each substrate was determined using the following device under the conditions mentioned below.

Device: PHI-5400MC (ULBAK•PHI Inc)

Source of X ray: $MgK_\alpha$ (400 W)

Pass energy: 71.55 eV

Area analyzed: 1.1 mm φ

Angle for taking out of the photoelectron: 45 degree (i) On the surface of thus treated substrate, the composition comprising compound A as described in Examples 1 to 14 was coated in an amount of 15 mg/$m^2$ and it was then dried for 10 seconds at 80° C. Then a coating solution of photosensitive composition A as described in Examples 1 to 14 was coated thereon to form a photosensitive layer. The amount of the photosensitive layer coated after dried was 1.3 g/$m^2$. Further, a mat layer was formed thereon in order to reduce the time required for evacuation during contact exposure as disclosed in J.P. KOKOKU No. Sho 61-28986 to prepare a presensitized plate for the preparation of lithographic printing plate.

Thus prepared presensitized plate for the preparation of lithographic printing plate was imagewise exposed with a 3 kW metal halide lamp at a distance from 1 m for 1 minute. The exposed plate was developed with developer A or B as described in Examples 1 to 14 using PS processor 900VR (manufactured by Fuji Photo Film Co. Ltd.) at 30° C. for 12 seconds (Examples 24 to 28 and Comparative Examples 11 to 13).

Thus developed lithographic printing plate was tested for its printing durability, contamination property, remaining of color and remaining of film, and mud·sludge in the developer. The results were shown in Table 7. These properties were evaluated as described in Examples 1 to 14.

As shown in the table below, when the printing plates having a certain degree of phosphorization was developed with a developer comprising no silicate (Examples 24 to 28) show good properties of contamination, durability, remaining of color, remaining of film and do not cause any mud and sludge in the developer. However, the printing plates of which phosphorization degree is out of the range defined in the present invention (degree of phosphorization=0.4, Comparative Example 11) does not show sufficient properties of contamination, remaining of film, and mud·sludge. Also, when the printing plate prepared from a substrate of which phosphorization degree is 0.74 was developed with a developer comprising no silicate (Comparative Example 12) shows low printing durability. In addition, when the printing plate prepared from a substrate having the phosphorization degree in the range of the present invention was developed with silicate (Comparative Example 13) resulted in deterioration of properties relating to mud and sludge, remaining of color and remaining of film.

TABLE 7

| Ex./ Com. Ex. | 1st bath (condition) | 2nd bath (condition) | Degree of P[1)] | Dev. | Con. | MS | Dur. | RC (ΔD) | RF (ΔD) |
|---|---|---|---|---|---|---|---|---|---|
| Example | | | | | | | | | |
| 24 | hexasodium hexametaphosphate 10% + barium fluoride 1% (90° C., 30 sec.) | None | 0.65 | A | 22 | ○ | 50,000 | 0.05 | 0.05 |
| 25 | ammonium phosphate 2% + No. 3 sodium silicate 1% (50° C., 15 sec.) | None | 0.31 | A | 21 | ○ | 45,000 | 0.02 | 0.06 |
| 26 | sodium dihydrogenphosphate 10%, (50° C., 20 sec.) | potassium silicate 0.5% (30° C., 10 sec.) | 0.47 | A | 22 | ○ | 45,000 | 0.03 | 0.07 |
| 27 | sodium fluoride 0.1% + sodium dihydrogenphosphate 10% (60° C., 10 sec) | None | 0.16 | A | 21 | ○ | 50.000 | 0.04 | 0.04 |
| 28 | polyvinylphosphonic acid 2% + sodium fluoride 1% (70° C., 1 min.) | None | 0.25 | A | 24 | ○ | 50,000 | 0.01 | 0.02 |
| Com. Ex. | | | | | | | | | |
| 11 | hexasodium hexametaphosphate 0.1% (70° C., 30 sec.) | None | 0.04 | A | 35 | X | 50,000 | 0.03 | 0.09 |
| 12 | hexasodium hexametaphosphate 10%, (90° C., 5 min.) | None | 0.74 | A | 24 | ○ | 25,000 | 0.02 | 0.04 |
| 13 | sodium fluoride 0.1% + sodium dihydrogenphosphate 10% (80° C., 30 sec.) | None | 0.47 | B | 24 | X | 50,000 | 0.10 | 0.25 |

[1)]Degree of P: Degree of phosphorization (A/(A + B)), Dev: Developer, Con.: Contamination, MS: Mud and sludge, Dur: Durability, RC: Remaining of color, RF: Remaining of film

Examples 29 to 31 and Comparative Examples 14 to 16

After substrate D was treated according to Table 8 below, compound A was coated thereon as described in Examples 24 to 28 in an amount of 15 mg/$m^2$ followed by being dried at 80° C. for 10 seconds. Coating solution of photosensitive composition B as described in Examples 15 and 16 was prepared and it was coated on the undercoated substrate in an amount of 1.0 g/$m^2$ to provide a presensitized plate for the preparation of lithographic printing plate.

Thus obtained presensitized plate was image-wise exposed with a trendsetter (Creo company) (a plate setter with a semiconductive laser of 830 nm having 40 W of wavelength) at 150 rpm (drum winding number). Then the plate was developed with developer (A) comprising no silicate. (Examples 29 to 31 and Comparative Examples 14 to 16).

Contamination, printing durability, properties of remaining color and mud and sludge in the developer were evaluated as in Example 24 (Table 8). Also, sensitivity of the plate was evaluated as described below.

Sensitivity: The plate was exposed to light with the variety of amount of light and then developed. The density of the non-image area of the plate after development was determined by Macbeth densimeter. The amount of light adjacent before that by which the density of the non-image area suddenly increases was determined as the sensitivity of the plate.

The printing plate of the present invention, which was treated with an aqueous solution having a certain degree of phosphorization and developed with a developer comprising no silicate showed good properties in contamination, printing durability and remaining of color as well as high sensitivity. Also, there was no mud and sludge in the developer (Examples 29 to 31). However, the substrate of which degree of phosphorization is 0.04 and developed with a developer comprising no silicate (Comparative Example 14) showed deteriorated properties especially in printing durability, remaining of color and sensitivity. Also, when the printing plate of which degree of phosphorization is 0.74 and developed with a developer comprising no silicate (Comparative Example 15) showed deteriorated result especially in printing durability. When the printing plate prepared from a substrate having phosphorization degree in the range of the present invention (0.47) was developed with developer B comprising no silicate (Comparative Example 16), properties relating to remaining of color and sensitivity were deteriorated. Also, mud and sludge were observed in the developer.

TABLE 8

| Ex./ Com. Ex. | 1st bath | Degree of P[1)] | Dev. | Con. | MS | Dur. | RC (ΔD) | S (mJ/cm$^2$) |
|---|---|---|---|---|---|---|---|---|
| Example | | | | | | | | |
| 29 | hexasodium hexametaphosphate 10% + barium fluoride 1% (90° C., 30 sec.) | 0.65 | A | 22 | ○ | 50,000 | 0.02 | 50 |
| 30 | ammonium phosphate 2% + No. 3 sodium silicate 1% (50° C., 15 sec.) | 0.31 | A | 22 | ○ | 50,000 | 0.04 | 50 |
| 31 | polyvinylphosphonic acid 2% + sodium fluoride 1% (70° C., 1 min.) | 0.25 | A | 24 | ○ | 50,000 | 0.03 | 55 |
| Com. Ex. | | | | | | | | |
| 14 | hexasodium hexametaphosphate 0.1% (70° C., 30 sec.) | 0.04 | A | 30 | X | 50,000 | 0.12 | 80 |
| 15 | hexasodium hexametaphosphate 10% (90° C., 5 min.) | 0.74 | A | 22 | ○ | 25,000 | 0.05 | 50 |
| 16 | sodium fluoride 0.1% + sodium dihydrogenphosphate 10% (80° C., 30 sec.) | 0.47 | B | 22 | X | 50,000 | 0.15 | 70 |

[1)]Degree of P: Degree of phosphorization (A/(A + B)), Dev.: Developer, Con.: Contamination, MS: mud and sludge in the developer, Dur: Durability, RC: Remaining of color, S: Sensitivity Effect of the Invention The method for the preparation of lithographic printing plate provides a photosensitive or thermosensitive plate having excellent properties relating to remaining of color, remaining of film, contamination and printing durability and also inhibits the formation of mud and sludge in the developer. Also, a plate having a high sensitivity can be obtained.

What is claimed is:

1. A preparation method for a lithographic printing plate, which comprises forming a presensitized plate by coating a photosensitive layer or thermosensitive layer on an anodized aluminum substrate treated with an aqueous solution, imagewise exposing the plate and developing the plate with a developer comprising no silicate, wherein the aqueous solution comprises at least one compound selected from the group consisting of nitrite group-containing compound, fluorine atom-containing compound and phosphorous atom-containing compound, with the proviso that when the at least one compound is fluorine atom-containing compound, the treated aluminum substrate has a surface which satisfies the formula: $0.3 \leqq A/(A+B) \leqq 0.90$ wherein, A represents peak area of fluorine atom (1S) (count·eV/sec) determined by X ray Electron Spectroscopy for Chemical Analysis (ESCA), and B represents peak area of aluminum atom (2P) (count·eV/sec) determined by X ray ESCA and, when the at least one compound is phosphorous atom-containing compound, the treated aluminum substrate has a surface which satisfies the formula: $0.05 \leqq A/(A+B) \leqq 0.70$ wherein, A represents peak area of phosphorous atom (2P) (count·eV/sec) determined by X ray ESCA, and B represents peak area of aluminum atom (2P) (count·eV/sec) determined by X ray ESCA, and wherein an intermediate layer is present between the anodized aluminum substrate and the photosensitive layer or thermosensitive layer and said intermediate layer is comprised of polymer compound comprising acid group and onium group.

2. The method of claim 1, wherein the nitrite group-containing compound is selected from the group consisting of nitrous acid, metal salt of nitrous acid and ammonium salt of nitrous acid.

3. The method of claim 1, wherein the fluorine atom-containing compound is selected from the group consisting of metal fluoride and hexafluorozirconic acid, hexafluorotitanic acid, hexafluorosilicic acid, fluorophosphoric acid, and metal or ammonium salt thereof.

4. The method of claim 1, wherein the phosphorous atom-containing compound is selected from the group consisting of phosphoric acid, phosphotungstic acid, phosphomolybdic acid, fluorophosphoric acid, phosphorous acid, hypophosphorous acid, polyphosphoric acid, metaphosphoric acid, metal or ammonium salt thereof, and phosphonic acid group-containing compound.

5. The method of claim 1, wherein the developer comprising no silicate is a developer comprising (a) at least one sugar selected from non-reducing sugars and (b) at least one base (except for silicate) and having pH ranging from 9.0 to 13.5.

6. A preparation method for a lithographic printing plate, which comprises forming a presensitized plate by coating a positive-working photosensitive layer or positive-working thermosensitive layer on an anodized aluminum substrate treated with an aqueous solution, image-wise exposing the plate and developing the plate with a developer comprising no silicate, wherein the aqueous solution comprises at least one compound selected from the group consisting of nitrite group-containing compound, fluorine atom-containing compound and phosphorous atom-containing compound with the proviso that when the at least one compound is fluorine atom-containing compound, the treated aluminum substrate has a surface which satisfies the formula: $0.30 \leqq A/(A+B) \leqq 0.90$ wherein, A represents peak area of fluorine atom (1S) (count·eV/sec) determined by X ray Electron Spectroscopy for Chemical Analysis (ESCA), and B represents peak area of aluminum atom (2P) (count·eV/sec) determined by X ray ESCA, and when the at least one compound is phosphorous atom-containing compound, the treated aluminum substrate has a surface which satisfies the formula: $0.05 \leqq A/(A+B) \leqq 0.70$ wherein, A represents peak area of phosphorous atom (2P) (count·eV/sec) determined by X ray ESCA, and B represents peak area of aluminum atom (2P) (count·eV/sec) determined by X ray ESCA, and wherein an intermediate layer is present between the anodized aluminum substrate and the photosensitive layer or thermosensitive layer and said intermediate layer is comprised of polymer compound comprising acid group and onium group.

7. The method of claim 6, wherein the nitrite group-containing compound is selected from the group consisting of nitrous acid, metal salt of nitrous acid and ammonium salt of nitrous acid.

8. The method of claim 6, wherein the fluorine atom-containing compound is selected from the group consisting of metal fluoride and hexafluorozirconic acid, hexafluorotitanic acid, hexafluorosilicic acid, fluorophosphoric acid, and metal or ammonium salt thereof.

9. The method of claim 6, wherein the phosphorous atom-containing compound is selected from the group consisting of phosophoric acid, phosphotungstic acid, phosphomolybdic acid, fluorophosphoric acid, phosphorous acid, hypophosphorous acid, polyphosphoric acid, metaphosphoric acid, metal or ammonium salt thereof, and phosphoric acid group-containing compound.

10. The method of claim 6, wherein the developer comprising no silicate is a developer comprising (a) at least one sugar selected from non-reducing sugars and (b) at least one base (except for silicate) and having pH ranging from 9.0 to 13.5.

11. A preparation method for a lithographic printing plate, which comprises forming a presensitized plate by coating a photosensitive layer or thermosensitive layer on an anodized aluminum substrate treated with an aqueous solution, image-wise exposing the plate and developing the plate with a developer comprising no silicate, wherein the aqueous solution comprises at least one compound selected from the group consisting of nitrite group-containing compound, fluorine atom-containing compound and phosphorous atom-containing compound, with the proviso that when the at least one compound is fluorine atom-containing compound, the treated aluminum substrate has a surface which satisfies the formula: $0.30 \leqq A/(A+B) \leqq 0.90$ wherein, A represents peak area of fluorine atom (1S) (count·eV/sec) determined by X ray Electron Spectroscopy for Chemical Analysis (ESCA), and B represents peak area of aluminum atom (2P) (count·eV/sec) determined by X ray ESCA, and, when the at least one compound is phosphorous atom-containing compound, the treated aluminum substrate has a surface which satisfies the formula: $0.05 \leqq A/(A+B) \leqq 0.70$ wherein, A represents peak area of phosphorous atom (2P) (count·eV/sec) determined by X ray ESCA, and B represents peak area of aluminum atom (2P) (counts eV/sec) determined by X ray ESCA, and wherein an intermediate layer is present between the anodized aluminum substrate and the photosensitive layer or thermosensitive layer and said intermediate layer is comprised of polymer compound comprising acid group.

12. The method of claim 11, wherein the nitrite group-containing compound is selected from the group consisting of nitrous acid, metal salt of nitrous acid and ammonium salt of nitrous acid.

13. The method of claim 11, wherein the fluorine atom-containing compound is selected from the group consisting of metal fluoride and hexafluorozirconic acid, hexafluorotitanic acid, hexafluorosilicic acid, fluorophosphoric acid, and metal or ammonium salt thereof.

14. The method of claim 11, wherein the phosphorous atom-containing compound is selected from the group consisting of phosphoric acid, phosphotungstic acid, phosphomolybdic acid, fluorophosphoric acid, phosphorous acid, hypophosphorous acid, polyphosphoric acid, metaphosphoric acid, metal or ammonium salt thereof, and phosphonic acid group-containing compound.

15. The method of claim 15, wherein the developer comprising no silicate is a developer comprising (a) at least one sugar selected from non-reducing sugars and (b) at least one base (except for silicate) and having pH ranging from 9.0 to 13.5.

* * * * *